(12) United States Patent
Weis et al.

(10) Patent No.: US 7,994,536 B2
(45) Date of Patent: Aug. 9, 2011

(54) INTEGRATED CIRCUIT INCLUDING U-SHAPED ACCESS DEVICE

(75) Inventors: Rolf Weis, Dresden (DE); Thomas Happ, Dresden (DE)

(73) Assignee: Qimonda AG, Munich (DE)

( * ) Notice: Subject to any disclaimer, the term of this patent is extended or adjusted under 35 U.S.C. 154(b) by 462 days.

(21) Appl. No.: 12/033,533

(22) Filed: Feb. 19, 2008

(65) Prior Publication Data

US 2009/0206316 A1 Aug. 20, 2009

(51) Int. Cl.
*H01L 29/00* (2006.01)
*H01L 21/00* (2006.01)
*G11C 19/00* (2006.01)

(52) U.S. Cl. ......... 257/154; 257/E29.141; 257/E27.006; 438/3; 365/175

(58) Field of Classification Search .......... 438/3; 257/4, 257/154, 326
See application file for complete search history.

(56) References Cited

U.S. PATENT DOCUMENTS

| | | | | |
|---|---|---|---|---|
| 6,025,225 | A * | 2/2000 | Forbes et al. | 438/243 |
| 6,441,396 | B1 * | 8/2002 | Adams et al. | 257/48 |
| 6,624,033 | B2 * | 9/2003 | Noble | 438/300 |
| 6,847,094 | B2 * | 1/2005 | Schwartzmann | 257/549 |
| 6,995,446 | B2 | 2/2006 | Karpov et al. | |
| 7,247,876 | B2 | 7/2007 | Lowrey | |
| 7,283,383 | B2 | 10/2007 | Kang | |
| 7,446,372 | B2 * | 11/2008 | Forbes | 257/328 |
| 7,608,848 | B2 * | 10/2009 | Ho et al. | 257/3 |
| 2002/0081807 | A1 * | 6/2002 | Xu | 438/262 |
| 2006/0125014 | A1 * | 6/2006 | Chong et al. | 257/355 |
| 2006/0186483 | A1 | 8/2006 | Cho et al. | |
| 2006/0284237 | A1 | 12/2006 | Park et al. | |
| 2007/0218665 | A1 | 9/2007 | Sutardja et al. | |
| 2009/0206315 | A1 * | 8/2009 | Weis et al. | 257/4 |

OTHER PUBLICATIONS

"Full Integration of Highly Manufacturable 512Mb PRAM Based on 90nm Technology", J. H. Oh, et al., IEEE, 2006 (4 pgs.).
"Highly Reliable 50 nm Contact Cell Technology for 256 Mb PRAM", S. J. Ahn, et al., Samsung Electronics Co., Ltd. (2 pgs.), Symposium on VLSI Tech Digest, 2005.
"OUM—A 180 nm Nonvolatile Memory Cell Element Technology for Stand Alone and Embedded Applications", Stefan Lai, et al., Intel Corporation (4 pgs.), IEEE IDEM, Dec. 2001 pp. 36.5.1-36.5.4.
"Ovonic Unified Memory—A High-performance Nonvolatile Memory Technology for Stand ALone Memory and Embedded Applications", Manzur Gill, et al., Intel Corporation, Ovonyx Corporation, Azalea Corporation, (4 pgs.), IEEE International, Solid State Circuits Conference Feb. 2002.

* cited by examiner

*Primary Examiner* — W. David Coleman
(74) *Attorney, Agent, or Firm* — Dicke, Billig & Czaja, PLLC

(57) ABSTRACT

An integrated circuit includes a U-shaped access device and a first line coupled to a first side of the access device. The integrated circuit includes a contact coupled to a second side of the access device and self-aligned dielectric material isolating the first line from the contact.

25 Claims, 22 Drawing Sheets

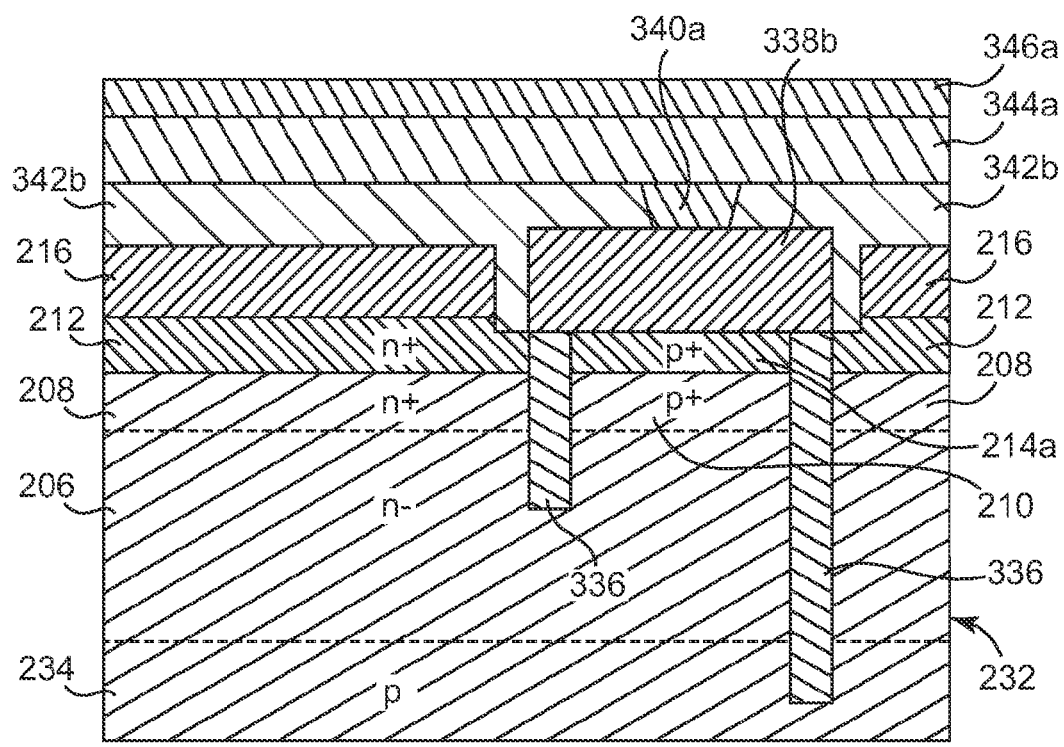
Fig. 29A
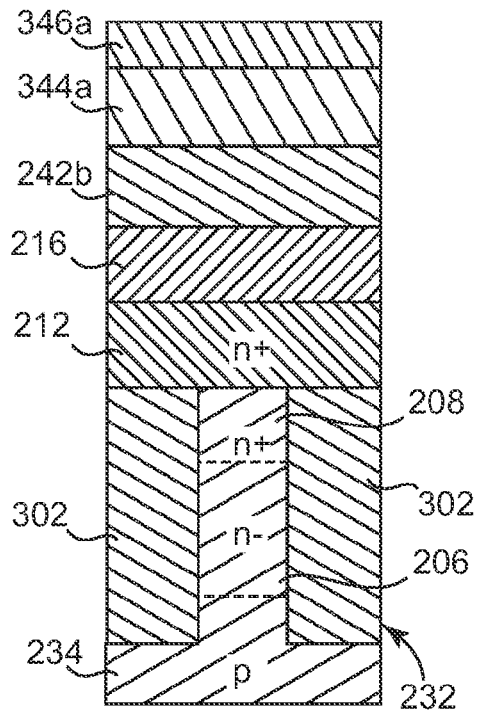 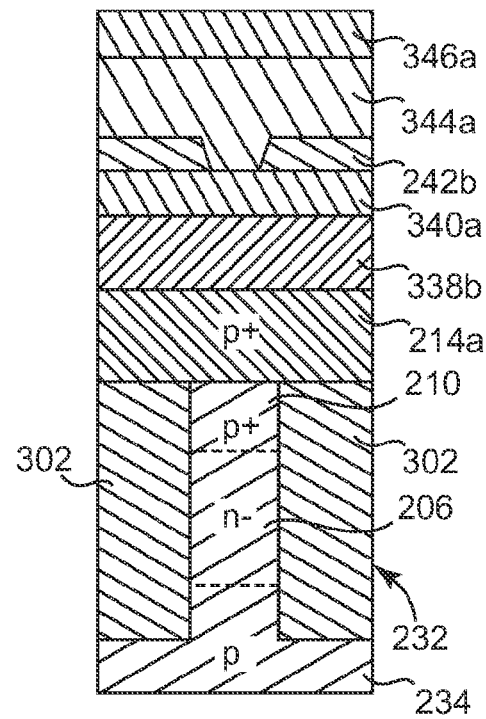
Fig. 29B      Fig. 29C

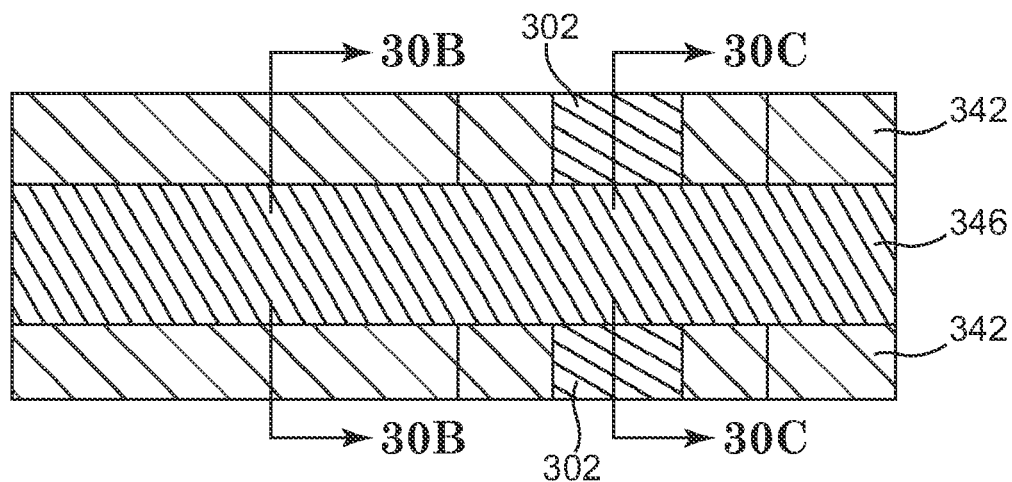
Fig. 30A
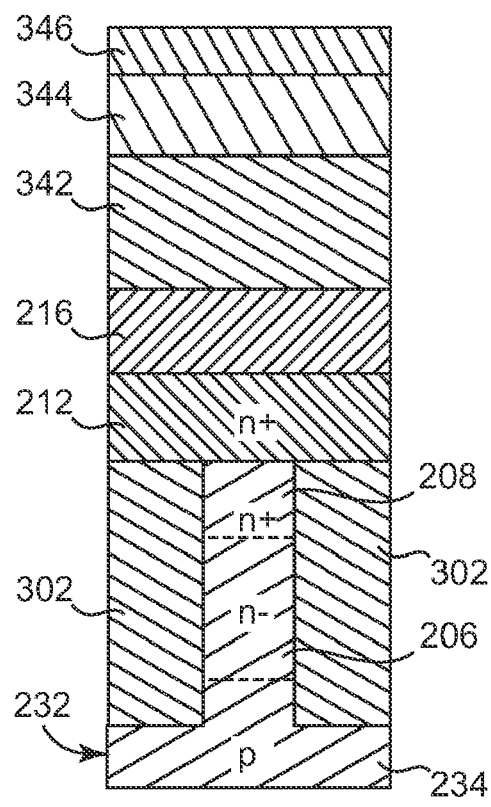 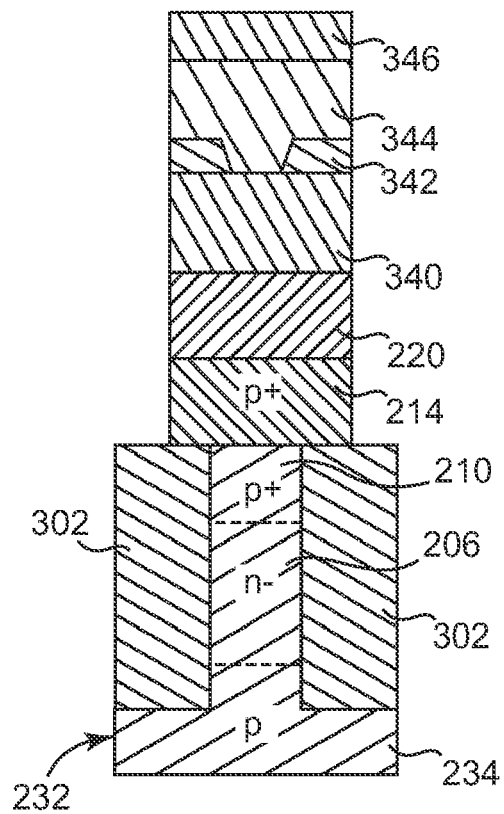
Fig. 30B      Fig. 30C

INTEGRATED CIRCUIT INCLUDING U-SHAPED ACCESS DEVICE

CROSS-REFERENCE TO RELATED APPLICATIONS

This application is related to U.S. patent application Ser. No. 12/033,519, entitled "INTEGRATED CIRCUIT INCLUDING U-SHAPED ACCESS DEVICE," filed on the same date as the present application, which is incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a pattern of voltage pulses or a current pulse or a pattern of current pulses to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse or a pattern of pulses that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory. A relatively high current is used to reset a phase change memory cell. The access device used to access a phase change memory cell has to be capable of providing the high current. The high current can most efficiently (i.e., with the smallest memory cell size) be provided by a bipolar device such as a diode. Diodes are typically fabricated after transistor formation using a selective epitaxy process, which requires an ultra-high vacuum chemical vapor deposition (UHV-CVD) tool to meet the temperature budget requirements.

For these and other reasons, there is a need for the present invention.

SUMMARY

One embodiment provides an integrated circuit. The integrated circuit includes a U-shaped access device and a first line coupled to a first side of the access device. The integrated circuit includes a contact coupled to a second side of the access device and self-aligned dielectric material isolating the first line from the contact.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 29A illustrates a cross-sectional view of one embodiment of the substrate, the doped polysilicon layers, the word lines, a nitride layer, the oxide, the contact material layer, the bottom electrode material layer, a phase change material layer, and a top electrode material layer.

FIG. 29B illustrates another cross-sectional view of one embodiment of the substrate, the doped polysilicon layers, the word lines, the nitride layer, the oxide, the contact material layer, the bottom electrode material layer, the phase change material layer, and the top electrode material layer.

FIG. 29C illustrates another cross-sectional view of one embodiment of the substrate, the doped polysilicon layers, the word lines, the nitride layer, the oxide, the contact material layer, the bottom electrode material layer, the phase change material layer, and the top electrode material layer.

FIG. 30A illustrates a top view of one embodiment of the substrate, the doped polysilicon layers, the word lines, a nitride layer, the oxide, a contact, a bottom electrode, a phase change element, and a bit line after etching.

FIG. 30B illustrates a cross-sectional view of one embodiment of the substrate, the doped polysilicon layers, the word lines, the nitride layer, the oxide, the contact, the phase change element, and the bit line after etching.

FIG. 30C illustrates another cross-sectional view of one embodiment of the substrate, the doped polysilicon layers, the word lines, the nitride layer, the oxide, the contact, the phase change element, and the bit line after etching.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
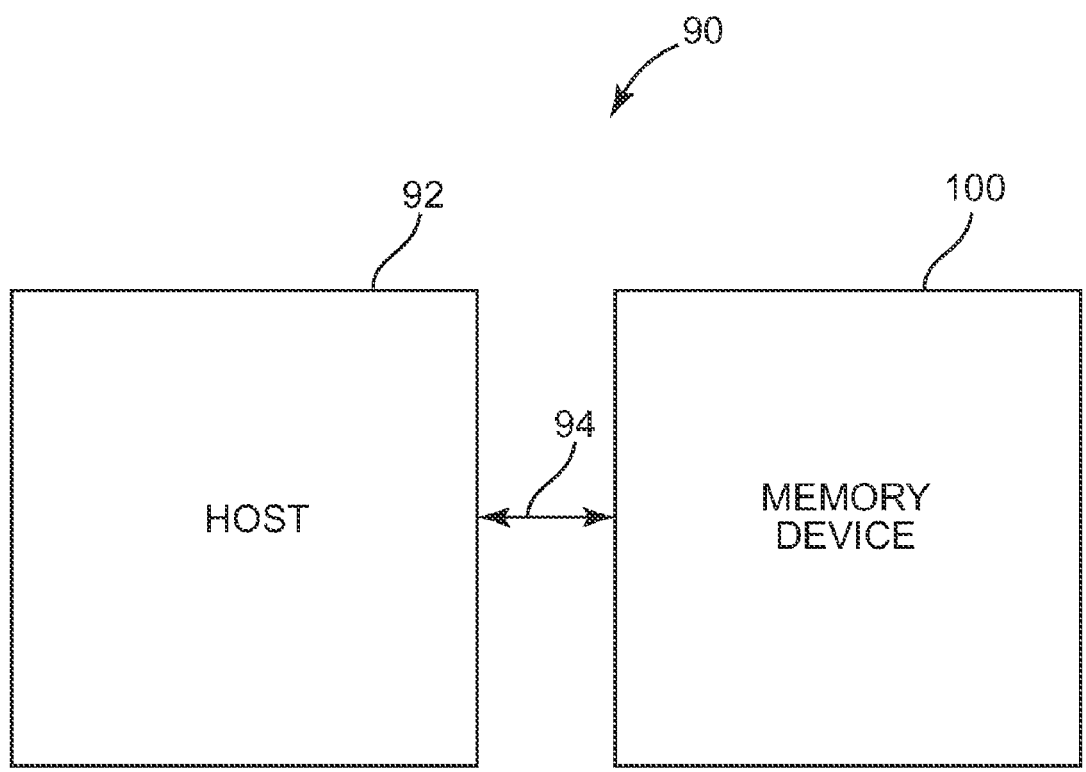
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 provides embedded memory for host 92 and host 92 and memory device 100 are included on a single integrated circuit or circuit board. In one embodiment, memory device 100 includes a phase change memory device or other suitable resistive or resistivity changing material memory device.

Figure 2:
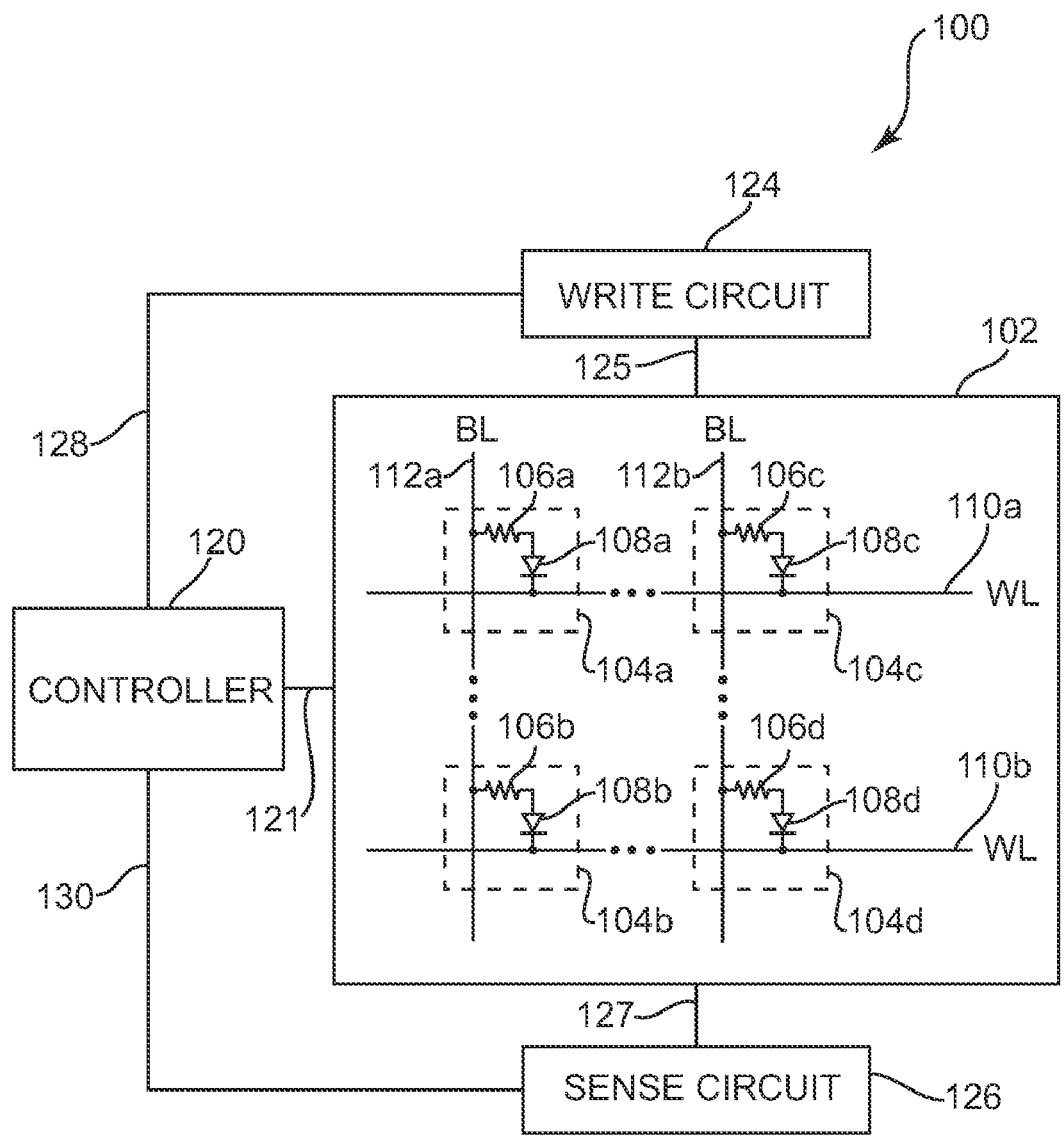
FIG. 2 is a diagram illustrating one embodiment of a memory device.

FIG. 2 is a diagram illustrating one embodiment of memory device 100. Memory device 100 includes a write circuit 124, a controller 120, a memory array 102, and a sense circuit 126. Memory array 102 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells. In other embodiments, resistive memory cells 104 are another suitable type of resistive memory cells or resistivity changing memory cells.

Each memory cell 104 includes a phase change element 106 and a diode 108. Diodes 108 are U-shaped and formed in a silicon on insulator (SOI) substrate or local SOI structures between isolation regions. As used herein, the term "U-shaped" includes any substantially U, J, or backward J shape. In another embodiment, diodes 108 are replaced by bipolar transistors. The bipolar transistors are U-shaped and formed in a substrate having a common potential, such as ground. The bipolar transistors are formed between isolations regions such that one side of each bipolar transistor is coupled to common or ground. Therefore, the bipolar transistors function similarly to diodes. Diodes 108 are fabricated without selective epitaxy, which requires the use of an ultra-high vacuum chemical vapor deposition (UHV-CVD) tool to meet the temperature budget requirements.

As used herein, the term "electrically coupled" is not meant to mean that the elements must be directly coupled together and intervening elements may be provided between the "electrically coupled" elements.

Memory array 102 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b.

Each phase change memory cell 104 includes a phase change element 106 and a diode 108. Phase change memory cell 104a includes phase change element 106a and diode 108a. One side of phase change element 106a is electrically coupled to bit line 112a, and the other side of phase change element 106a is electrically coupled to one side of diode 108a. The other side of diode 108a is electrically coupled to word line 110a. In another embodiment, the polarity of diode 108a is reversed.

Phase change memory cell 104b includes phase change element 106b and diode 108b. One side of phase change element 106b is electrically coupled to bit line 112a, and the other side of phase change element 106b is electrically coupled to one side of diode 108b. The other side of diode 108b is electrically coupled to word line 110b.

Phase change memory cell 104c includes phase change element 106c and diode 108c. One side of phase change element 106c is electrically coupled to bit line 112b and the other side of phase change element 106c is electrically coupled to one side of diode 108c. The other side of diode 108c is electrically coupled to word line 110a.

Phase change memory cell 104d includes phase change element 106d and diode 108d. One side of phase change element 106d is electrically coupled to bit line 112b and the other side of phase change element 106d is electrically coupled to one side of diode 108d. The other side of diode 108d is electrically coupled to word line 110b.

In another embodiment, each phase change element 106 is electrically coupled to a word line 110 and each diode 108 is electrically coupled to a bit line 112. For example, for phase change memory cell 104a, one side of phase change element 106a is electrically coupled to word line 110a. The other side of phase change element 106a is electrically coupled to one side of diode 108a. The other side of diode 108a is electrically coupled to bit line 112a.

In one embodiment, each phase change element 106 comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistance. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a set operation of phase change memory cell 104a, one or more set current or voltage pulses are selectively enabled by write circuit 124 and sent through bit line 112a to phase change element 106a, thereby heating phase change element 106a above its crystallization temperature (but usually below its melting temperature). In this way, phase change element 106a reaches its crystalline state or a partially crystalline and partially amorphous state during this set operation.

During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

Phase change memory cells 104b-104d and other phase change memory cells 104 in memory array 102 are set and reset similarly to phase change memory cell 104a using similar current or voltage pulses. In other embodiments, for other types of resistive memory cells, write circuit 124 provides suitable programming pulses to program the resistive memory cells 104 to the desired state.

Figure 3:
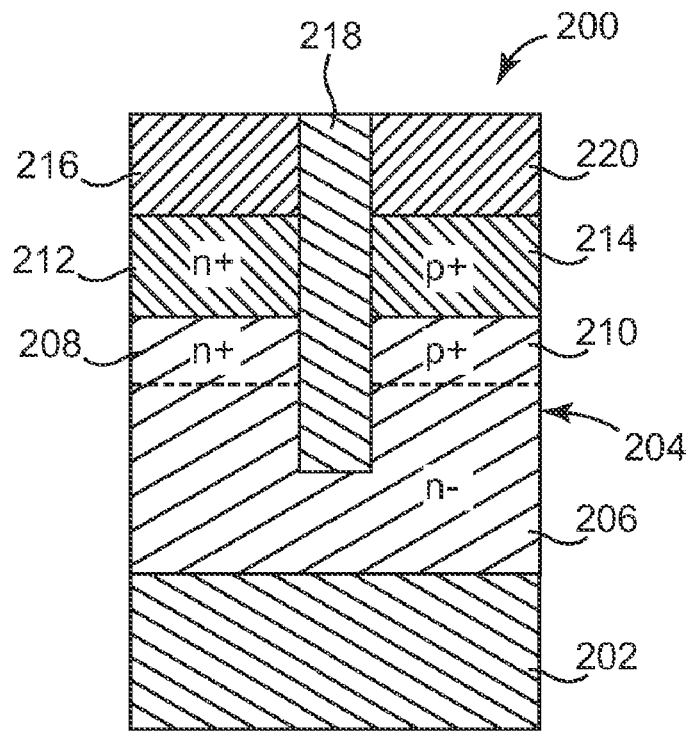
FIG. 3 illustrates a cross-sectional view of one embodiment of a U-shaped diode access device.

FIG. 3 illustrates a cross-sectional view of one embodiment of a U-shaped diode access device 200. In one embodiment, a U-shaped diode access device 200 is used for each diode 108 previously described and illustrated with reference to FIG. 2. U-shaped diode access device 200 includes a silicon on insulator (SOI) substrate or local SOI structure 204, polysilicon layers or contacts 212 and 214, and contacts or lines 216 and 220. A diode is formed in substrate 204, which includes insulation material 202 and silicon regions 206, 208, and 210.

The diode includes a lightly doped (n−) region 206, a heavily doped (n+) region 208, and a heavily doped (p+) region 210. The top of n− doped region 206 contacts the bottom of n+ doped region 208 and the bottom of p+ doped region 210. In one embodiment, n+ doped region 208 is in the same horizontal plane as p+ doped region 210 and is isolated from p+ doped region 210 by dielectric material 218, thereby giving the diode a U-shape. In another embodiment, n+ doped region 208 is not in the same horizontal plane as p+ doped region 210, but n+ doped region 208 is still isolated from p+ doped region 210 by dielectric material 218, thereby maintaining the U-shape of the diode. In another embodiment, the polarity of the diode is reversed, such that region 206 is p− doped, region 208 is p+ doped, and region 210 is n+ doped.

The top of n+ doped region 208 contacts the bottom of n+ doped polysilicon layer 212. The top of n+ doped polysilicon layer 212 contacts the bottom of contact or line 216. The top of p+ doped region 210 contacts the bottom of p+ doped polysilicon layer 214. The top of p+ doped polysilicon layer 214 contacts the bottom of contact or line 220. The n+ doped polysilicon layer 212 is in the same horizontal plane as p+ doped polysilicon layer 214, and contact or line 216 is in the same horizontal plane as contact or line 220. The n+ doped polysilicon layer 212 and contact or line 216 are separated from p+ doped polysilicon layer 214 and contact or line 220 by dielectric material 218. In another embodiment, where the polarity of the diode is reversed, polysilicon layer 212 is p+ doped and polysilicon layer 214 is n+ doped.

In one embodiment, dielectric material 218 is self-aligned between contacts or lines 216 and 220. Insulation material 202 and dielectric material 208 include $SiO_2$, $SiO_x$, $Si_xN_y$, fluorinated silica glass (FSG), boro-phosphorous silicate glass (BPSG), boro-silicate glass (BSG), or other suitable dielectric material. In one embodiment, contact or line 216 is a word line and contact or line 220 is a contact for coupling to a phase change element. Contacts or lines 216 and 220 include TiN, TaN, W, Al, Ti, Ta, TiSiN, TaSiN, TiAlN, TaAlN, Cu, WN, CoSi, NiSi, NiPtSi, WSi, a combination thereof, or other suitable electrically conductive material.

Figure 4:
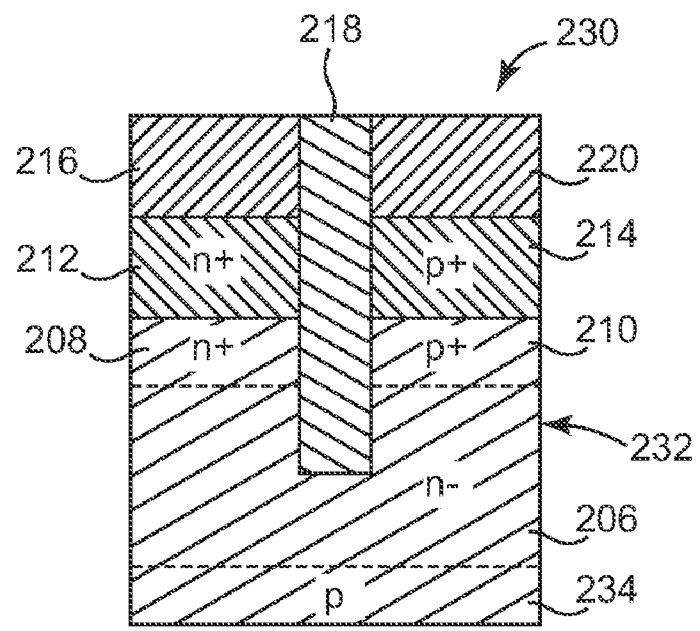
FIG. 4 illustrates a cross-sectional view of one embodiment of a bipolar transistor access device.

FIG. 4 illustrates a cross-sectional view of one embodiment of a bipolar transistor access device 230. In one embodiment, a U-shaped bipolar transistor access device 230 is used in place of each diode 108 previously described and illustrated with reference to FIG. 2. U-shaped bipolar transistor access device 230 includes a silicon substrate 232, polysilicon layers or contacts 212 and 214, and contacts or lines 216 and 220. A bipolar transistor is formed in substrate 232, which includes silicon regions 234, 206, 208, and 210.

The bipolar transistor includes a p doped region 234, an n− doped region 206, an n+ doped region 208, and a p+ doped region 210. In one embodiment, p doped region 234 is electrically coupled to common or ground such that the emitter-base path of the bipolar transistor acts as a diode. The top of p doped region 234 contacts the bottom of n− doped region 206. The top of n− doped region 206 contacts the bottom of n+ doped region 208 and the bottom of p+ doped region 210. In one embodiment, n+ doped region 208 is in the same horizontal plane as p+ doped region 210 and is isolated from p+ doped region 210 by dielectric material 218, thereby giving the bipolar transistor a U-shape. In another embodiment, n+ doped region 208 is not in the same horizontal plane as p+ doped region 210, but n+ doped region 208 is still isolated from p+ doped region 210 by dielectric material 218, thereby maintaining the U-shape of the bipolar transistor. In another embodiment, the polarity of the bipolar transistor is reversed, such that region 234 is n doped, region 206 is p− doped, region 208 is p+ doped, and region 210 is n+ doped.

The top of n+ doped region 208 contacts the bottom of n+ doped polysilicon layer 212. The top of n+ doped polysilicon layer 212 contacts the bottom of contact or line 216. The top of p+ doped region 210 contacts the bottom of p+ doped polysilicon layer 214. The top of p+ doped polysilicon layer 214 contacts the bottom of contact or line 220. The n+ polysilicon layer 212 is in the same horizontal plane as p+ doped polysilicon layer 214, and contact or line 216 is in the same horizontal plane as contact or line 220. The n+ doped polysilicon layer 212 and contact or line 216 are separated from p+ doped polysilicon layer 214 and contact or line 220 by dielectric material 218. In another embodiment, where the polarity of the bipolar transistor is reversed, polysilicon layer 212 is p+ doped and polysilicon layer 214 is n+ doped.

In one embodiment, dielectric material 218 is self-aligned between contacts or lines 216 and 220. Dielectric material 218 includes $SiO_2$, $SiO_x$, $Si_xN_y$, FSG, BPSG, BSG, or other suitable dielectric material. In one embodiment, contact or line 216 is a word line and contact or line 220 is a contact for coupling to a phase change element. Contacts or lines 216 and 220 include TiN, TaN, W, Al, Ti, Ta, TiSiN, TaSiN, TiAlN, TaAlN, Cu, WN, CoSi, NiSi, NiPtSi, WSi, a combination thereof, or other suitable electrically conductive material.

Figure 5:
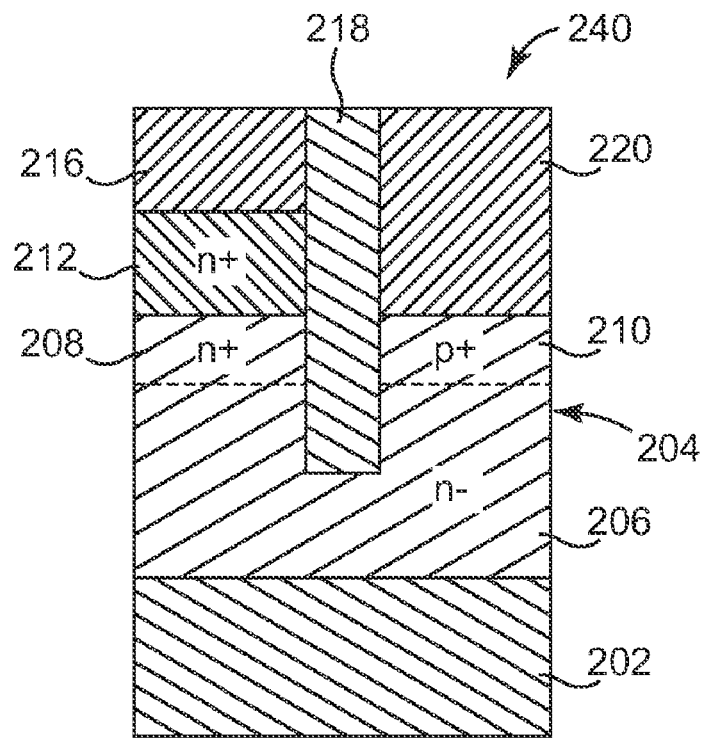
FIG. 5 illustrates a cross-sectional view of another embodiment of a U-shaped diode access device.

FIG. 5 illustrates a cross-sectional view of another embodiment of a U-shaped diode access device 240. U-shaped diode access device 240 is similar to U-shaped diode access device 200 previously described and illustrated with reference to FIG. 3, except that access device 240 does not include doped polysilicon layer 214. In this embodiment, the top of p+ doped region 210 is coupled to the bottom of contact or line 220. In one embodiment, p+ doped region 210 is coupled to contact or line 220 through a silicide layer.

Figure 6:
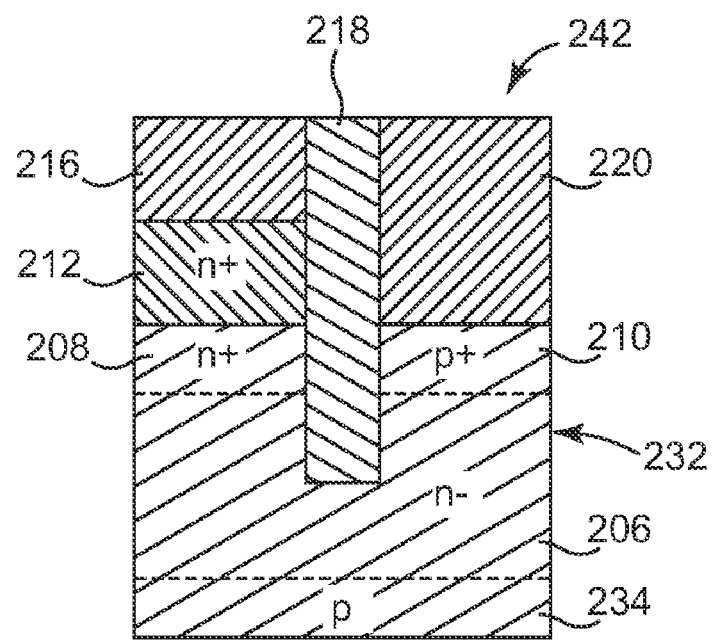
FIG. 6 illustrates a cross-sectional view of another embodiment of a bipolar transistor access device.

FIG. 6 illustrates a cross-sectional view of another embodiment of a bipolar transistor access device 242. U-shaped bipolar transistor access device 242 is similar to U-shaped bipolar transistor access device 230 previously described and illustrated with reference to FIG. 4, except that access device 242 does not include doped polysilicon layer 214. In this embodiment, the top of p+ doped region 210 is coupled to the bottom of contact or line 220. In one embodiment, p+ doped region 210 is coupled to contact or line 220 through a silicide layer.

Figure 7:
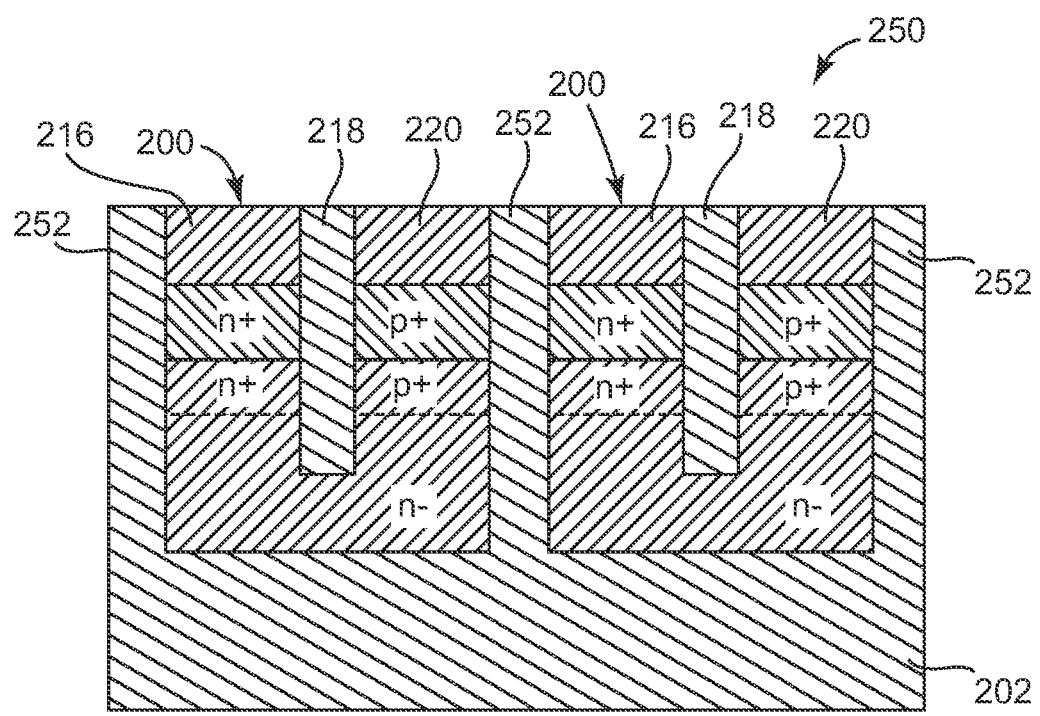
FIG. 7 illustrates a cross-sectional view of one embodiment of an array of diode access devices.

FIG. 7 illustrates a cross-sectional view of one embodiment of an array 250 of diode access devices 200. In one embodiment, array 250 is used to provide diodes 108 of memory array 102 previously described and illustrated with reference to FIG. 2. Each diode access device 200 is similar to diode access device 200 previously described and illustrated with reference to FIG. 3. Each diode access device 200 includes dielectric material 218, which is self-aligned between each contact or line 216 and each contact or line 220 of each diode access device 200. Adjacent diode access devices 200 are isolated from each other by insulation material 252, which is self-aligned between a contact or line 216 of one diode access device 200 and a contact or line 220 of an adjacent diode access device 200. Insulation material 202 and 252 and dielectric material 218 include $SiO_2$, $SiO_x$, $Si_xN_y$, FSG, BPSG, BSG, or other suitable dielectric material. In another embodiment, array 250 includes diode access devices 240 as previously described and illustrated with reference to FIG. 5 in place of diode access devices 200.

Figure 8:
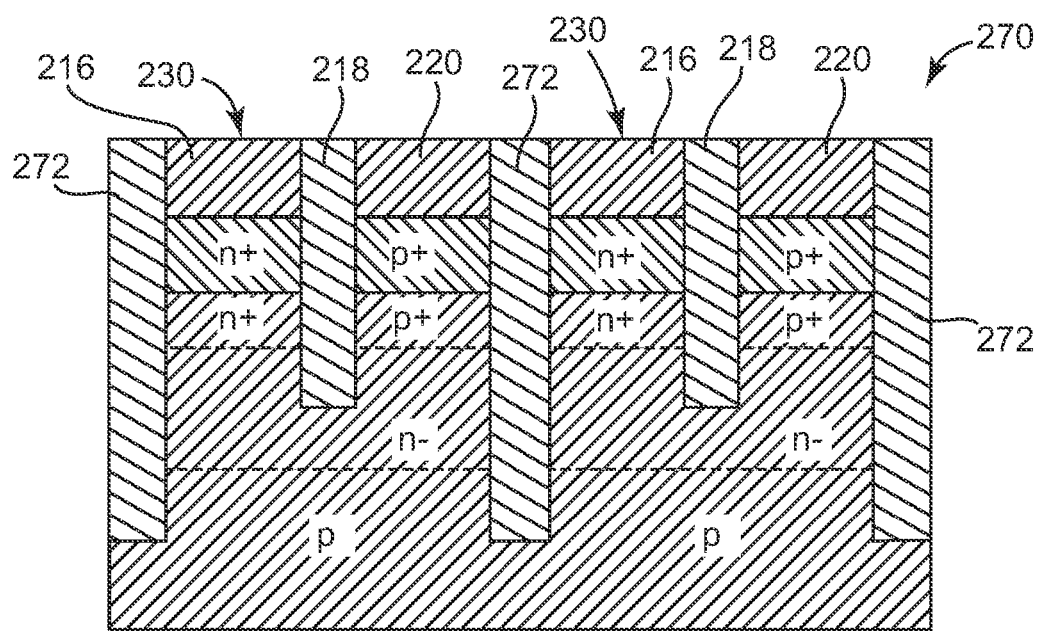
FIG. 8 illustrates a cross-sectional view of one embodiment of an array of bipolar transistor access devices.

FIG. 8 illustrates a cross-sectional view of another embodiment of an array 270 of bipolar transistor access devices 230. In one embodiment, array 270 is used to provide diodes 108 of memory array 102 previously described and illustrated with reference to FIG. 2. Each bipolar transistor access device 230 is similar to bipolar transistor access device 230 previously described and illustrated with reference to FIG. 4. Each bipolar transistor access device 230 includes dielectric material 218, which is self-aligned between each contact or line 216 and each contact or line 220 of each bipolar transistor access device 230. Adjacent bipolar transistor access devices 230 are isolated from each other by insulation material 272, which is self-aligned between a contact or line 216 of one bipolar transistor access device 230 and a contact or line 220 of an adjacent bipolar transistor access device 230. Insulation material 272 and dielectric material 218 include $SiO_2$, $SiO_x$, $Si_xN_y$, FSG, BPSG, BSG, or other suitable dielectric material. In another embodiment, array 270 includes bipolar transistor access devices 242 as previously described and illustrated with reference to FIG. 6 in place of bipolar transistor access devices 230.

The following FIGS. 9A-36B illustrate embodiments for a fabricating a phase change memory cell, such as a phase change memory cell 104 previously described and illustrated with reference to FIG. 2. Although the following FIGS. 9A-36B illustrate embodiments of a process for fabricating a phase change memory cell including a grounded bipolar transistor access device formed in a silicon substrate as previously described and illustrated with reference to FIG. 4, the illustrated process is also applicable to a phase change memory cell including a diode access device formed in a SOI structure or substrate as previously described and illustrated with reference to FIG. 3.

Figure 9A:
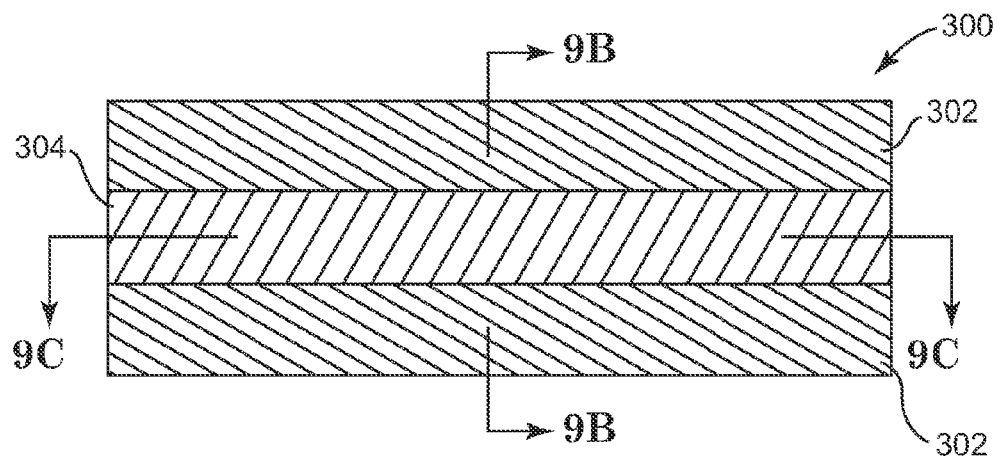
FIG. 9A illustrates a top view of one embodiment of a substrate.
Figure 9B:
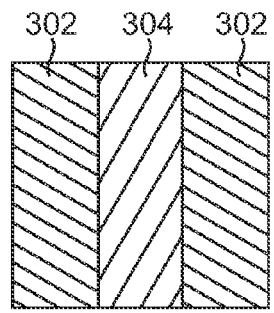
FIG. 9B illustrates a cross-sectional view of one embodiment of the substrate.
Figure 9C:
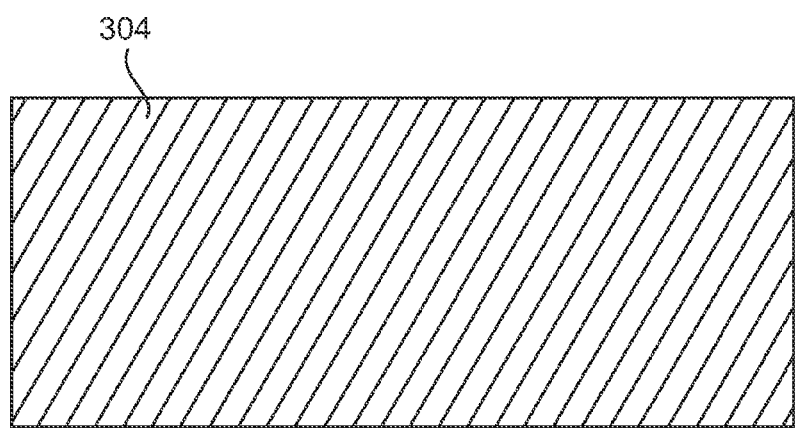
FIG. 9C illustrates another cross-sectional view of one embodiment of the substrate perpendicular to the view illustrated in FIG. 9B.

FIG. 9A illustrates a top view and FIGS. 9B and 9C illustrate cross-sectional views of one embodiment of a substrate 300. Substrate 300 includes insulation material 302 and an active area 304. In one embodiment, insulation material 302 includes isolation trenches. Active area 304 is between insulation material 302. Insulation material 302 includes $SiO_2$, $SiO_x$, $Si_xN_y$, FSG, BPSG, BSG, or other suitable dielectric material.

Figure 10A:
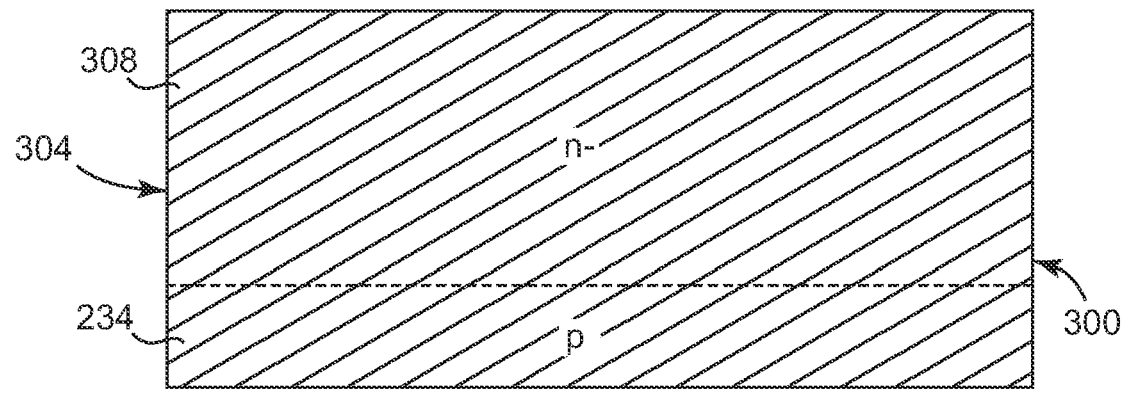
FIG. 10A illustrates a cross-sectional view of one embodiment of the substrate after doping.

FIG. 10A illustrates a cross-sectional view of one embodiment of substrate 300 after doping. Active area 304 of substrate 300 is doped to provide p doped region 234 and n− doped region 308. The top of p doped region 234 contacts the bottom of n− doped region 308. Active area 304 is doped using ion implantation or another suitable technique.

Figure 10B:
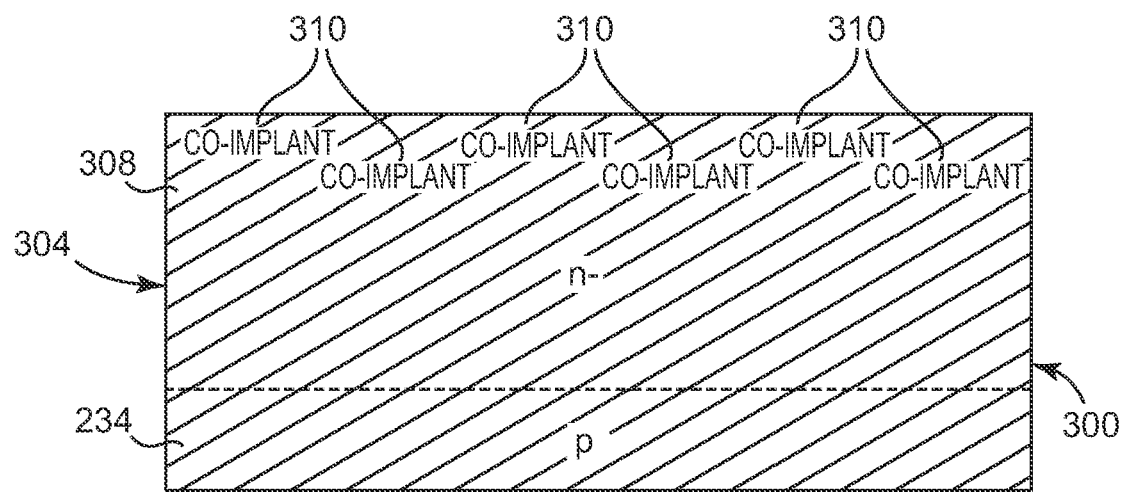
FIG. 10B illustrates a cross-sectional view of one embodiment of the substrate after doping including optional co-implants.

FIG. 10B illustrates a cross-sectional view of one embodiment of substrate 300 after doping including optional co-implants 310. This optional embodiment is similar to the embodiment previously described and illustrated with reference to FIG. 10A, except that in this embodiment co-implants 310 are included for controlling doping diffusion. Co-implants 310 are implanted near the surface of n− doped region 308. Co-implants 310 include sulfur, carbon, or other suitable material. While the following FIGS. 11-36B illustrate substrate 300 without co-implants 310, substrate 300 with co-implants 310 may also be used.

Figure 11:
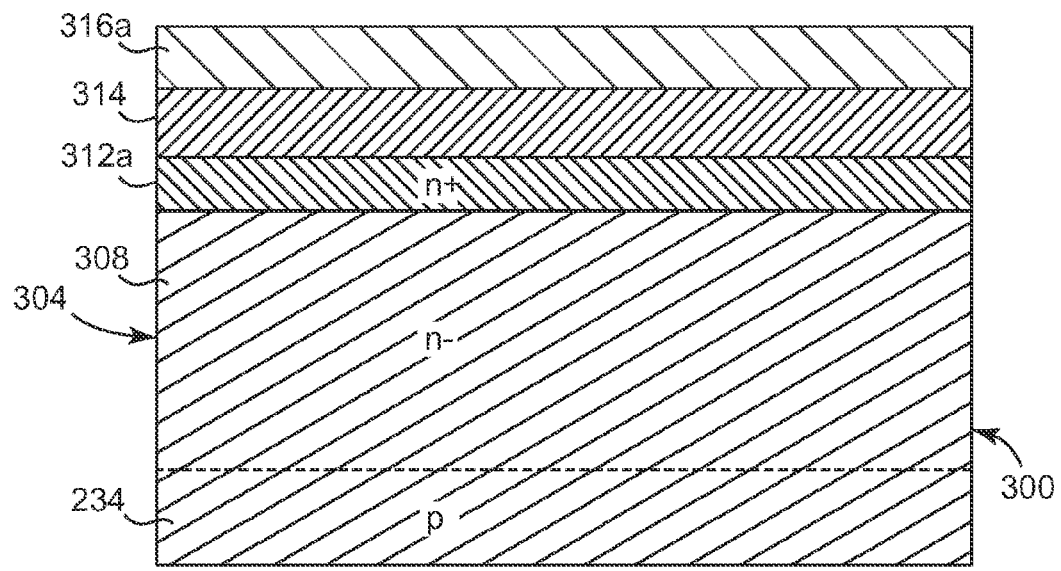
FIG. 11 illustrates a cross-sectional view of one embodiment of the substrate, a doped polysilicon layer, a word line material layer, and a nitride layer.

FIG. 11 illustrates a cross-sectional view of one embodiment of substrate 300, a doped polysilicon layer 312a, a word line material layer 314, and a nitride layer 316a. An n+ doped polysilicon is deposited over substrate 300 to provide n+ doped polysilicon layer 312a. Polysilicon layer 312a is deposited using chemical vapor deposition (CVD), low pressure chemical vapor deposition (LPCVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

An electrically conductive material, such as TiN, TaN, W, Al, Ti, Ta, TiSiN, TaSiN, TiAlN, TaAlN, Cu, WN, CoSi, NiSi, NiPtSi, WSi, a combination thereof, or other suitable word line material is deposited over n+ doped polysilicon layer 312a to provide word line material layer 314. Word line material layer 314 is deposited using CVD, LPCVD, HDP-CVD, ALD, MOCVD, PVD, JVD, or other suitable deposition technique. A nitride, such as $Si_xN_y$, or another suitable dielectric material is deposited over word line material layer 314 to provide nitride layer 316a. Nitride layer 316a is deposited using CVD, LPCVD, HDP-CVD, ALD, MOCVD, PVD, JVD, or other suitable deposition technique.

Figure 12:
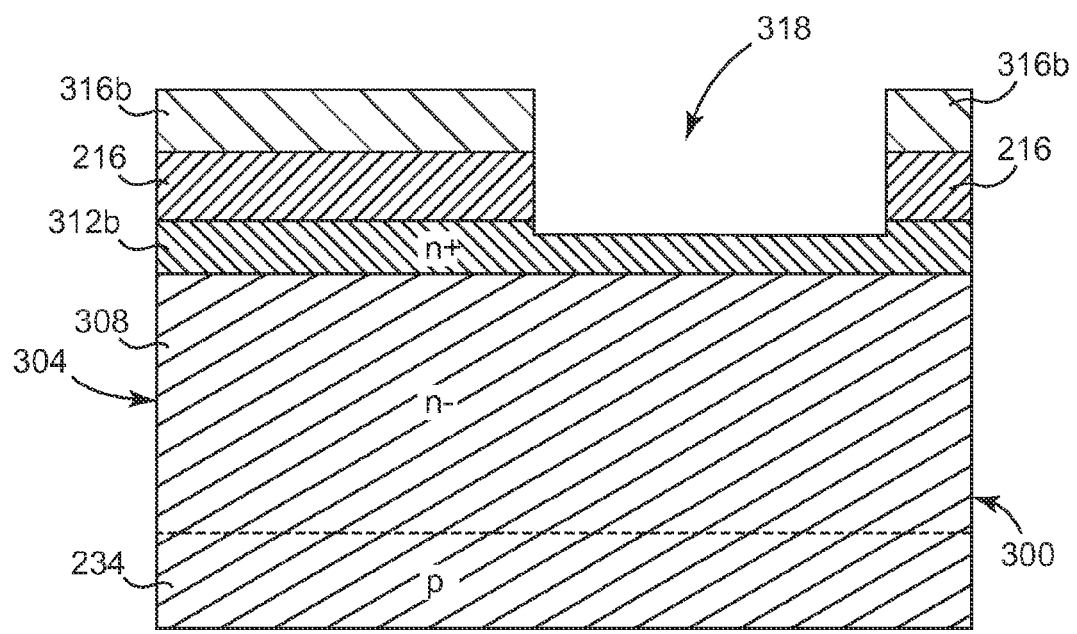
FIG. 12 illustrates a cross-sectional view of one embodiment of the substrate, the doped polysilicon layer, word lines, and the nitride layer after etching.

FIG. 12 illustrates a cross-sectional view of one embodiment of substrate 300, doped polysilicon layer 312b, word lines 216, and nitride layer 316b after etching. Nitride layer 316a, word line material layer 314, and n+ doped polysilicon layer 312a are etched to provide opening or trench 318 and n+ doped polysilicon layer 312b, word lines 216, and nitride layer 316b. Trench 318 is defined using a suitable lithography process.

Figure 13:
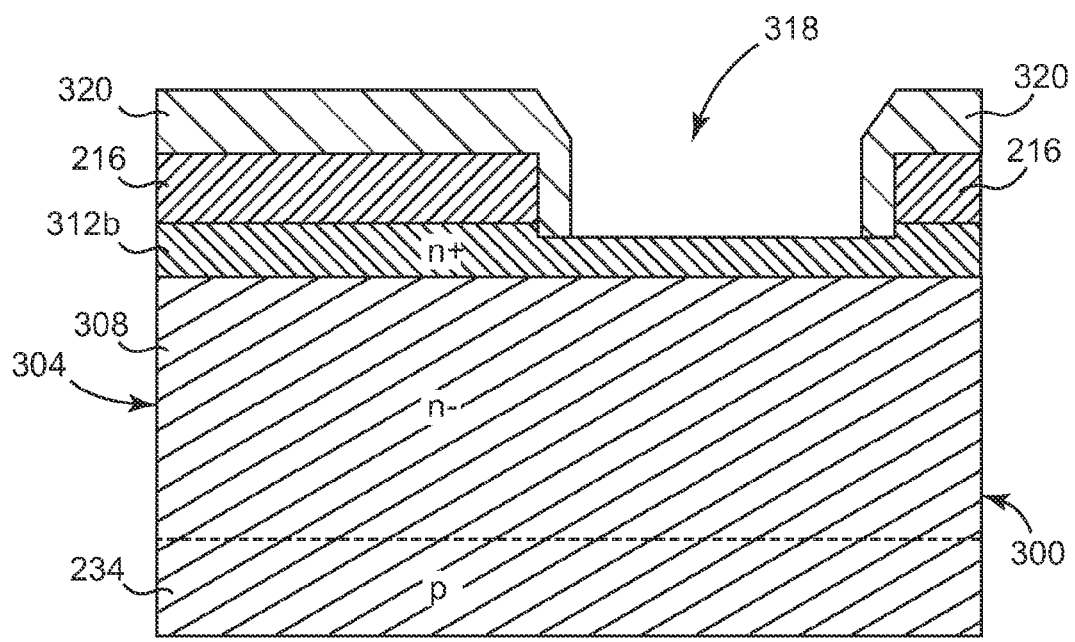
FIG. 13 illustrates a cross-sectional view of one embodiment of the substrate, the doped polysilicon layer, the word lines, and an optional nitride layer.

FIG. 13 illustrates a cross-sectional view of one embodiment of substrate 300, doped polysilicon layer 312b, word lines 216, and an optional nitride layer 320. A nitride, such as $Si_xN_y$ or another suitable dielectric material is deposited over exposed portions of nitride layer 316b, word lines 216, and n+ doped polysilicon layer 312b. The nitride layer is deposited using CVD, LPCVD, HDP-CVD, ALD, MOCVD, PVD, JVD, or other suitable deposition technique. The nitride layer is then spacer etched to expose a portion of n+ doped polysilicon layer 312b and to provide nitride layer 320, which includes nitride layer 316b. Nitride layer 320 encapsulates word lines 216 to protect word lines 216 from oxidation during subsequent processing. In other embodiments, where a non-oxidizing material is used for word lines 216, word lines 216 are not encapsulated.

Figure 14:
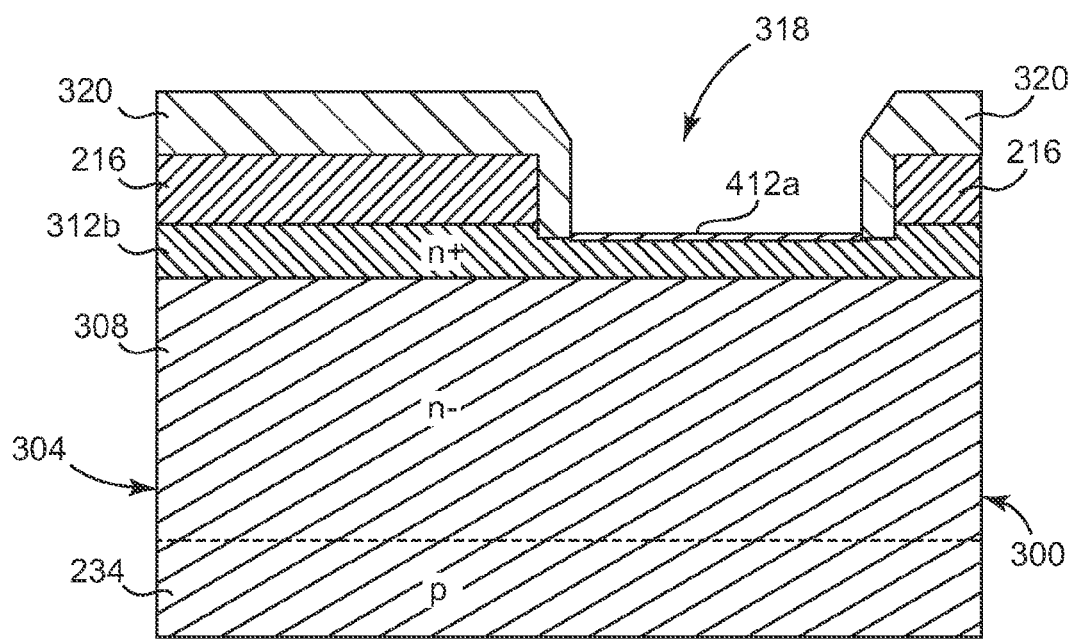
FIG. 14 illustrates a cross-sectional view of one embodiment of the substrate, the doped polysilicon layer, the word lines, the nitride layer, and a nitridation layer.

FIG. 14 illustrates a cross-sectional view of one embodiment of substrate 300, doped polysilicon layer 312b, word lines 216, nitride layer 320, and a nitridation layer 412a. A nitridation process is performed to form nitridation layer 412a on exposed portions of doped polysilicon layer 312b. In one embodiment, nitridation layer 412a includes $Si_xN_y$ or other suitable nitride.

Figure 15:
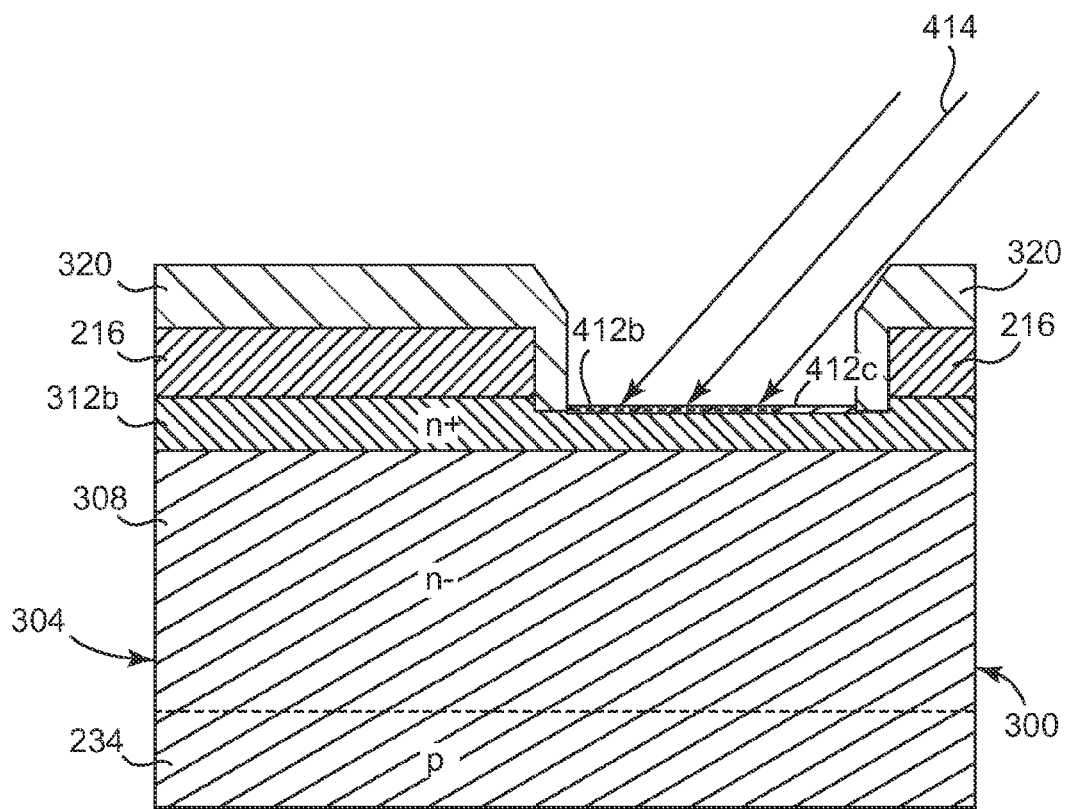
FIG. 15 illustrates a cross-sectional view of one embodiment of the substrate, the doped polysilicon layer, the word lines, the nitride layer, and the nitridation layer after an angled implantation.

FIG. 15 illustrates a cross-sectional view of one embodiment of substrate 300, doped polysilicon layer 312b, word lines 216, nitride layer 320, and nitridation layer 412b and 412c after an angled implantation. A portion of nitridation layer 412a is implanted using an angled implantation to provide damaged nitridation layer portion 412b and undamaged nitridation layer portion 412c.

Figure 16:
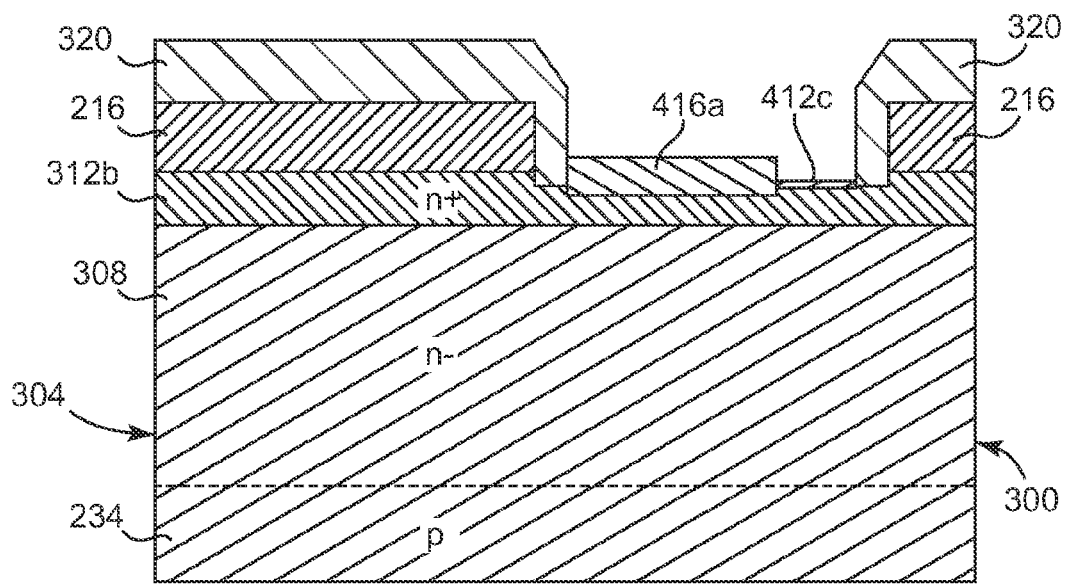
FIG. 16 illustrates a cross-sectional view of one embodiment of the substrate, the doped polysilicon layer, the word lines, the nitride layer, the nitridation layer, and an oxide layer.

FIG. 16 illustrates a cross-sectional view of one embodiment of substrate 300, doped polysilicon layer 312b, word lines 216, nitride layer 320, nitridation layer 412c, and an oxide layer 416a. Damaged nitridation layer portion 412b and the underlying portion of doped polysilicon layer 312b are oxidized to provide oxide layer 416a. Undamaged nitridation layer portion 412c is not affected by the oxidation process.

Figure 17:
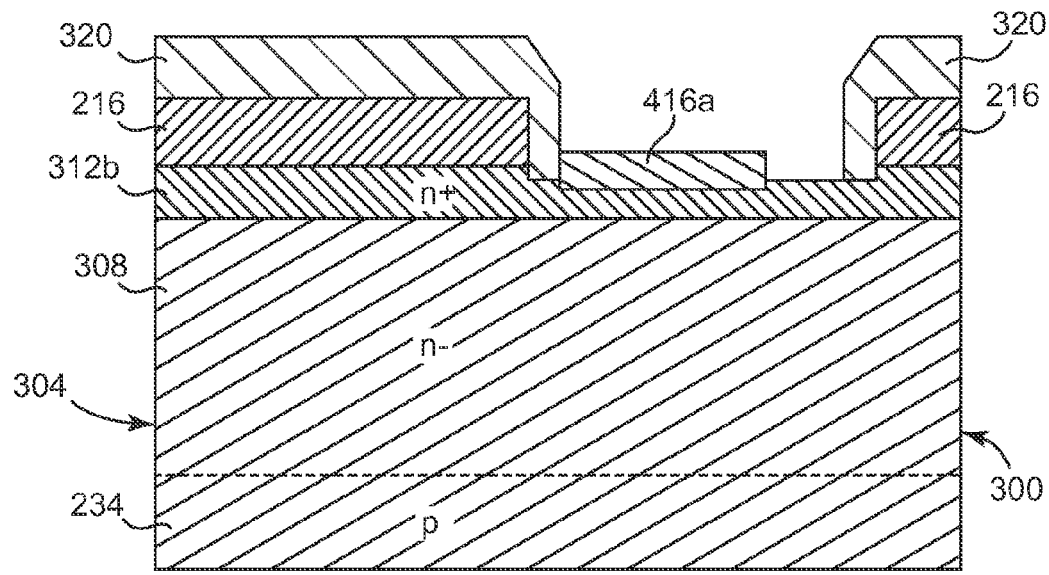
FIG. 17 illustrates a cross-sectional view of one embodiment of the substrate, the doped polysilicon layer, the word lines, the nitride layer, and the oxide layer after removing the nitridation layer.

FIG. 17 illustrates a cross-sectional view of one embodiment of substrate 300, doped polysilicon layer 312b, word lines 216, nitride layer 320, and oxide layer 416a after removing nitridation layer 412c. Nitridation layer 412c is stripped to expose a portion of n+ doped polysilicon layer 312b.

Figure 18:
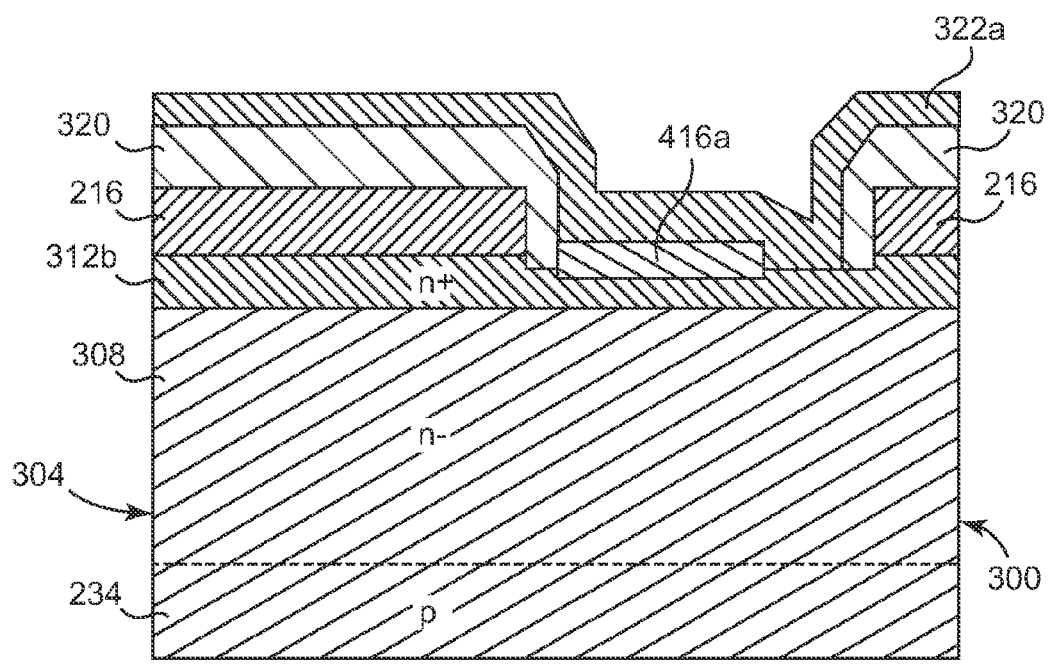
FIG. 18 illustrates a cross-sectional view of one embodiment of the substrate, the doped polysilicon layer, the word lines, the nitride layer, the oxide layer, and a polysilicon layer.

FIG. 18 illustrates a cross-sectional view of one embodiment of substrate 300, doped polysilicon layer 312b, word lines 216, nitride layer 320, oxide layer 416a, and a polysilicon layer 322a. Polysilicon is deposited over exposed portions of nitride layer 320, oxide layer 416a, and n+ doped polysilicon layer 312b to provide polysilicon layer 322a. Polysilicon layer 322a is deposited using CVD, LPCVD, HDP-CVD, ALD, MOCVD, PVD, JVD, or other suitable deposition technique. In one embodiment, polysilicon layer 322a is in situ p doped or p doped using ion implantation. In another embodiment, polysilicon layer 322a is replaced with an amorphous silicon layer.

Figure 19:
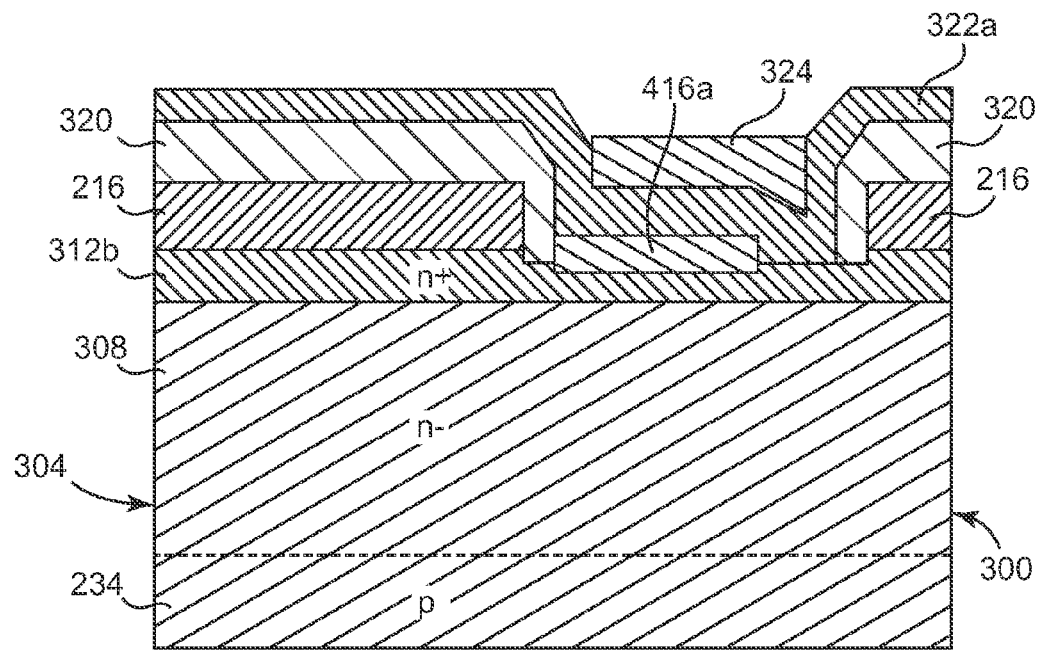
FIG. 19 illustrates a cross-sectional view of one embodiment of the substrate, the doped polysilicon layer, the word lines, the nitride layer, the polysilicon layer, and oxide layers.

FIG. 19 illustrates a cross-sectional view of one embodiment of substrate 300, doped polysilicon layer 312b, word lines 216, nitride layer 320, polysilicon layer 322a, and oxide layers 416a and 324. An oxide, such as $SiO_2$ or other suitable oxide is deposited over polysilicon layer 322a to provide an oxide layer. The oxide layer is deposited using CVD, LPCVD, HDP-CVD, ALD, MOCVD, PVD, JVD, or other suitable deposition technique. The oxide layer is then back-etched to provide oxide layer 324 and to expose portions of polysilicon layer 322a.

Figure 20:
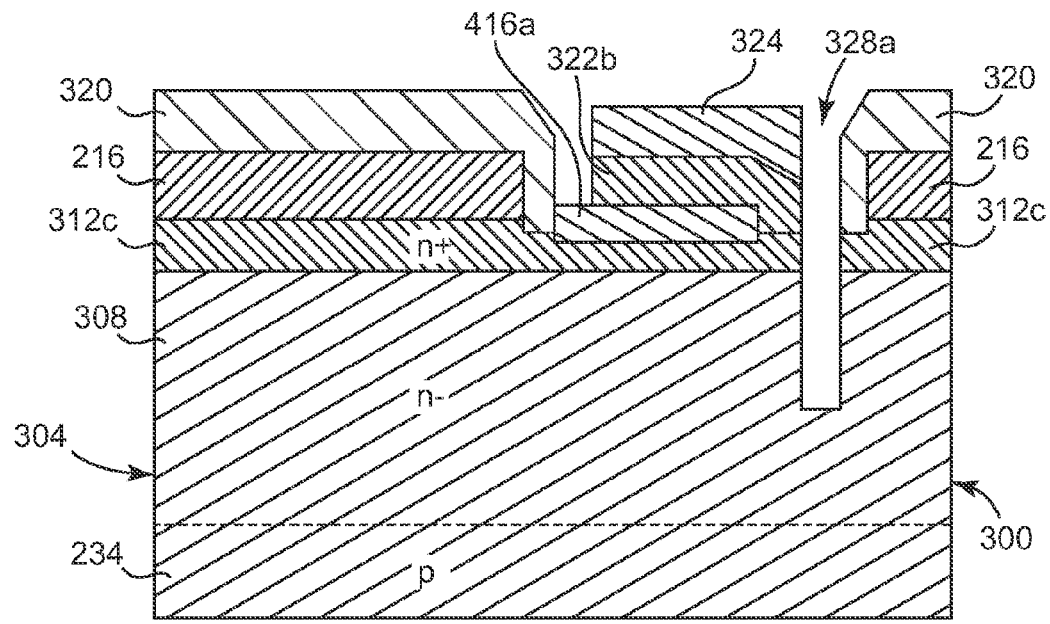
FIG. 20 illustrates a cross-sectional view of one embodiment of the substrate, the doped polysilicon layer, the word lines, the nitride layer, the polysilicon layer, and the oxide layers after etching a first opening.

FIG. 20 illustrates a cross-sectional view of one embodiment of substrate 300, doped polysilicon layer 312c, word lines 216, nitride layer 320, polysilicon layer 322b, and oxide layers 416a and 324 after etching a first opening 328a. The exposed portions of polysilicon layer 322a and the underlying portions of n+ doped polysilicon layer 312b are selectively etched to expose nitride layer 320, a portion of oxide layer 416a, and a portion of active area 304 of substrate 300. The etching provides n+ doped polysilicon layer 312c and polysilicon layer 322b. The exposed portion of active area 304 of substrate 300 is etched to provide first opening or trench 328a.

Figure 21:
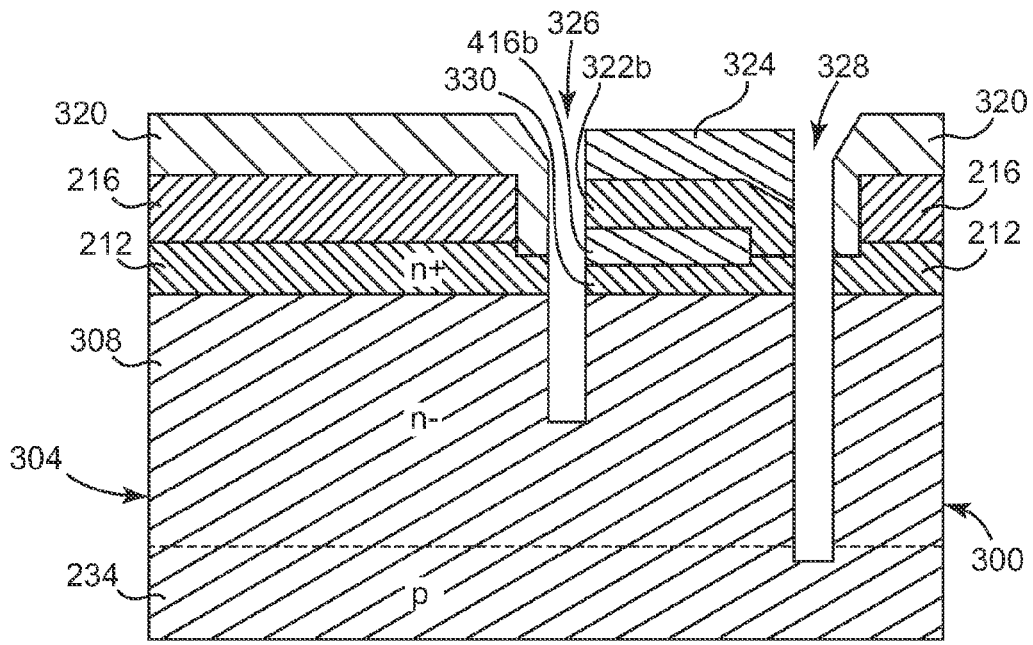
FIG. 21 illustrates a cross-sectional view of one embodiment of the substrate, the doped polysilicon layer, the word lines, the nitride layer, the polysilicon layer, and the oxide layers after etching a second opening.

FIG. 21 illustrates a cross-sectional view of one embodiment of substrate 300, doped polysilicon layer 212, word lines 216, nitride layer 320, polysilicon layer 322b, and oxide layers 416b and 324 after etching a second opening 326. The exposed portion of oxide layer 416a is etched to expose a portion of n+ doped polysilicon layer 312c and to provide oxide layer 416b. The exposed portion of n+ doped polysilicon layer 312c is etched to expose a portion of active area 304 of substrate 300 and to provide n+ doped polysilicon layers 212 and 330. The exposed portion of active area 304 of substrate 300 is then etched to provide second opening or trench 326 and to expand first opening 328a to provide first opening 328. In one embodiment, the depth of second opening 326 is less than the depth of first opening 328.

Figure 22:
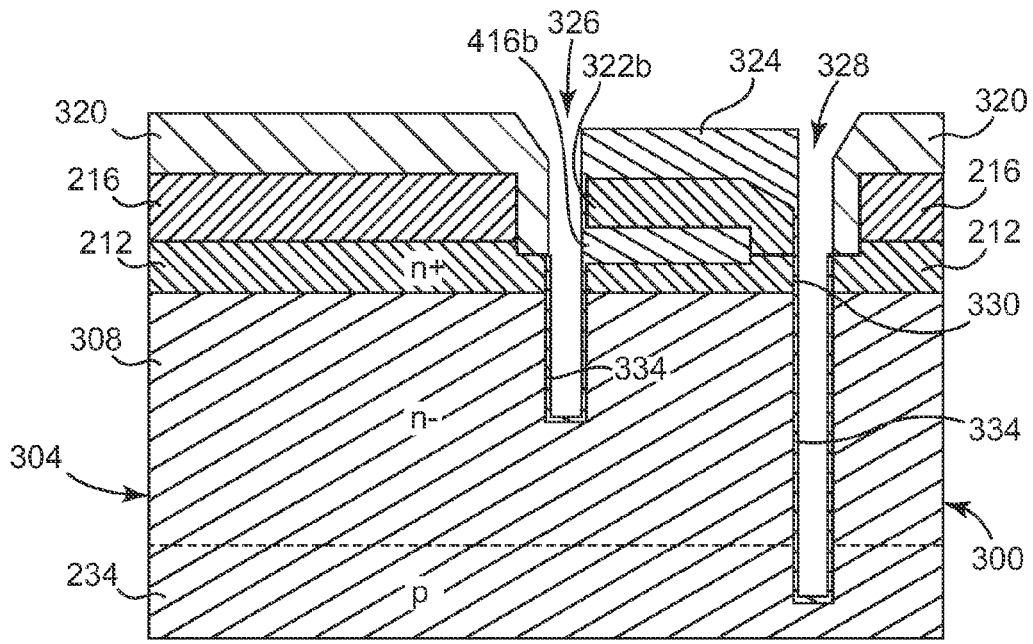
FIG. 22 illustrates a cross-sectional view of one embodiment of the substrate, the doped polysilicon layers, the word lines, the nitride layer, the polysilicon layer, and the oxide layers after oxidation.

FIG. 22 illustrates a cross-sectional view of one embodiment of substrate 300, doped polysilicon layers 212 and 330, word lines 216, nitride layer 320, polysilicon layer 322b, and oxide layers 416b and 324 after oxidation. The exposed portions of doped polysilicon layers 212 and 330, the exposed portions of polysilicon layer 322b, and the exposed portions of active area 304 are oxidized to provide oxide 334. In one embodiment, where word lines 216 are not encapsulated by nitride layer 320, the exposed portions of polysilicon layers 212 and 330, the exposed portions of polysilicon layer 322b, and the exposed portions of active area 304 are selectively oxidized to provide oxide 334.

Figure 23:
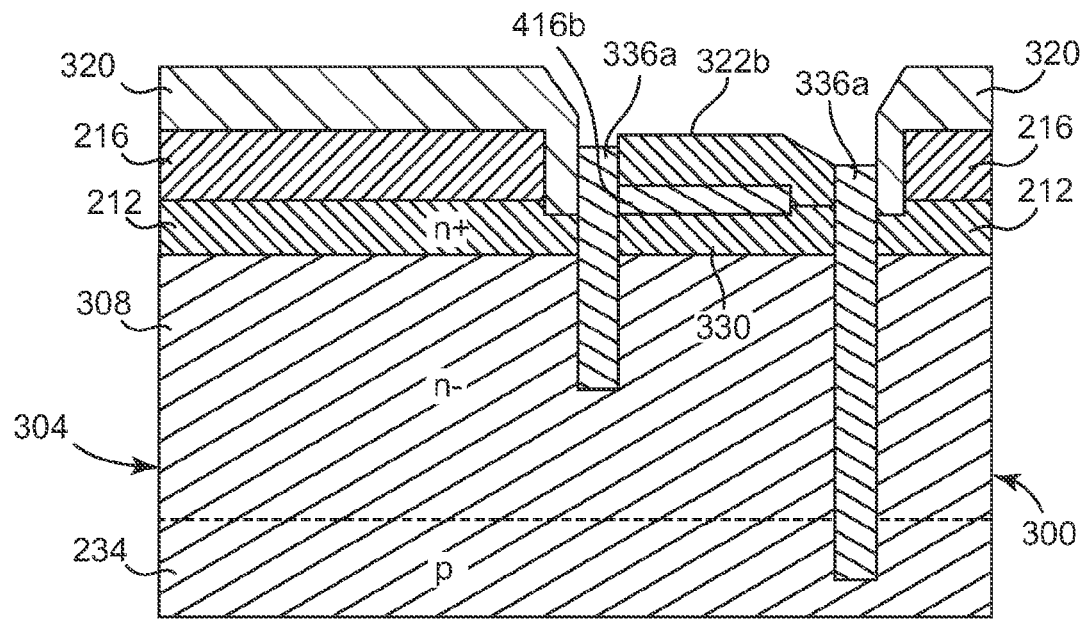
FIG. 23 illustrates a cross-sectional view of one embodiment of the substrate, the doped polysilicon layers, the word lines, the nitride layer, the polysilicon layer, the oxide layer, and oxide.

FIG. 23 illustrates a cross-sectional view of one embodiment of substrate 300, doped polysilicon layers 212 and 330, word lines 216, nitride layer 320, polysilicon layer 322b, oxide layer 416b, and oxide 336a. In one embodiment, a nitride is used in place of oxide 336a. An oxide or nitride, such as $SiO_2$, $Si_xN_y$, or other suitable dielectric material is deposited over nitride layer 320, oxide layer 324, and oxide 334 to provide an oxide or nitride layer. The oxide or nitride layer is deposited using CVD, LPCVD, HDP-CVD, ALD, MOCVD, PVD, JVD, or other suitable deposition technique. The oxide or nitride layer and oxide layer 324 are then back-etched to provide oxide or nitride 336a and to expose nitride layer 320 and polysilicon layer 322b.

Figure 24:
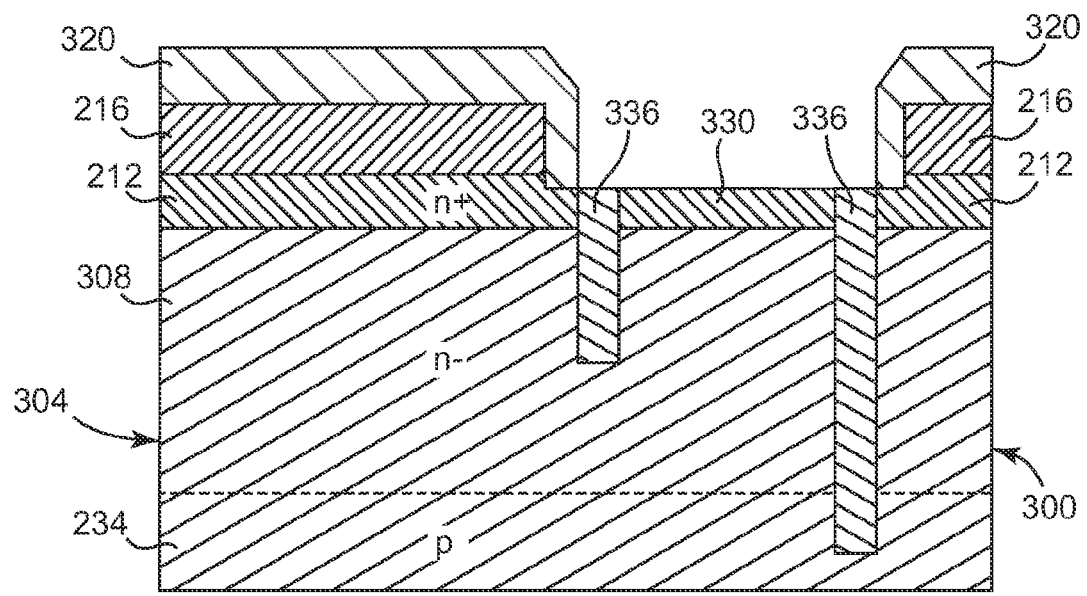
FIG. 24 illustrates a cross-sectional view of one embodiment of the substrate, the doped polysilicon layers, the word lines, the nitride layer, and the oxide after etching.

FIG. 24 illustrates a cross-sectional view of one embodiment of substrate 300, doped polysilicon layers 212 and 330, word lines 216, nitride layer 320, and oxide 336 after etching. Polysilicon layer 322b, oxide layer 416b and oxide 336a are etched to expose polysilicon layer 330 and to provide oxide 336.

Figure 25:
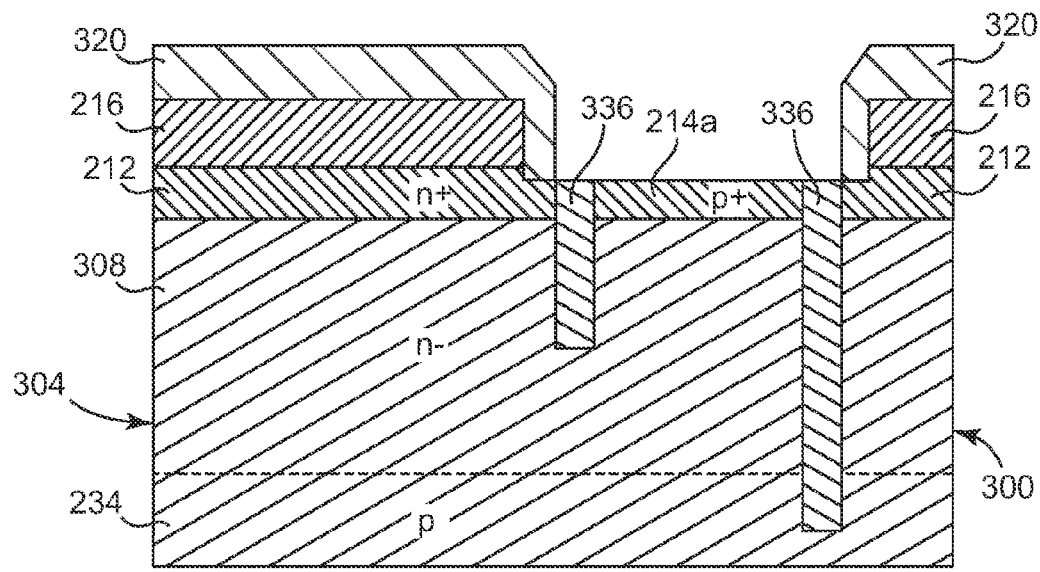
FIG. 25 illustrates a cross-sectional view of one embodiment of the substrate, the doped polysilicon layer, the word lines, the nitride layer, the oxide, and a doped polysilicon layer.

FIG. 25 illustrates a cross-sectional view of one embodiment of substrate 300, doped polysilicon layer 212, word lines 216, nitride layer 320, oxide 336, and a doped polysilicon layer 214a. In one embodiment, polysilicon layer 330 is doped and/or counter doped to provide p+ doped polysilicon layer 214a. In another embodiment, polysilicon layer 330 is back-etched and a p+ doped polysilicon layer is then deposited to provide p+ doped polysilicon layer 214a. In another embodiment, polysilicon layer 330 is back-etched and an undoped polysilicon layer is then deposited. The undoped polysilicon layer is then doped using ion implantation or another suitable technique to provide p+ doped polysilicon layer 214a.

Figure 26:
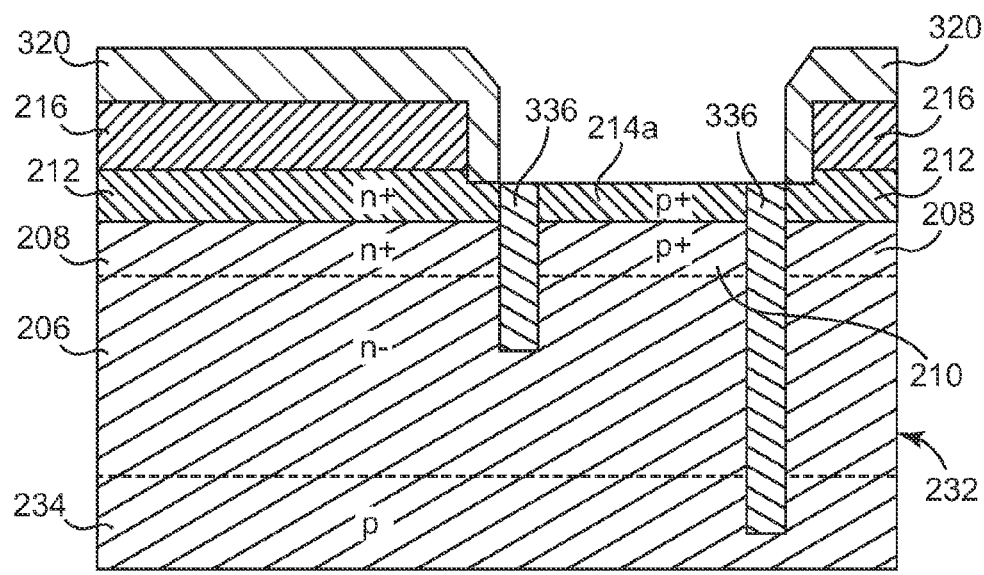
FIG. 26 illustrates a cross-sectional view of one embodiment of the substrate, the doped polysilicon layers, the word lines, the nitride layer, and the oxide after annealing.

FIG. 26 illustrates a cross-sectional view of one embodiment of substrate 232, doped polysilicon layers 212 and 214a, word lines 216, nitride layer 320, and oxide 336 after annealing. Substrate 300 and doped polysilicon layers 212 and 214a are annealed to provide substrate 232. During annealing, dopants from n+ doped polysilicon layer 212 diffuse into the underlying n– doped region 308 and dopants from p+ doped polysilicon layer 214a diffuse into the underlying n– doped region 308. The diffusion of dopants from n+ doped polysilicon layer 212 into n– doped region 308 provides n+ doped region 208. The diffusion of dopants from p+ doped polysilicon layer 214a into n– doped region 308 provides p+ doped region 210. The bottom of n+ doped region 208 and the bottom of p+ doped region 210 contact the top of n– doped region 206. The n+ doped region 208 is in the same horizontal plane as p+ doped region 210 and is separated from p+ doped region 210 by oxide 336. Therefore, a U-shaped bipolar transistor is formed in substrate 232.

Figure 27:
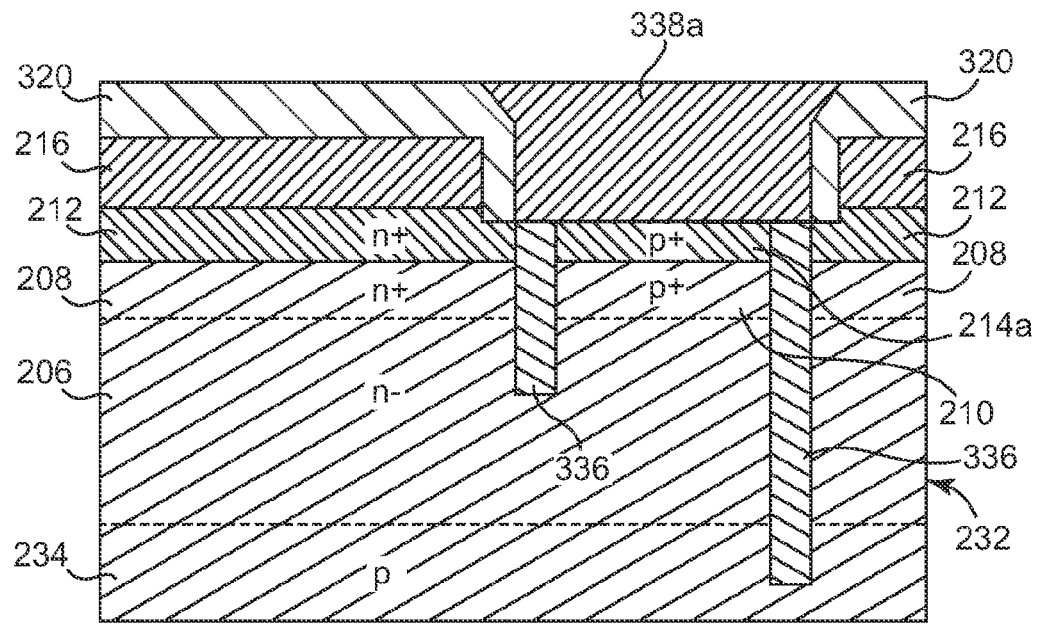
FIG. 27 illustrates a cross-sectional view of one embodiment of the substrate, the doped polysilicon layers, the word lines, the nitride layer, the oxide, and a contact material layer.

FIG. 27 illustrates a cross-sectional view of one embodiment of substrate 232, doped polysilicon layers 212 and 214a, word lines 216, nitride layer 320, oxide 336, and a contact material layer 338a. An electrically conductive material, such as TiN, TaN, W, Al, Ti, Ta, TiSiN, TaSiN, TiAlN, TaAlN, Cu, WN, CoSi, NiSi, NiPtSi, WSi, a combination thereof, or other suitable contact material is deposited over exposed portions of nitride layer 320, oxide 336, and p+ doped polysilicon layer 214a to provide a contact material layer. The contact material layer is deposited using CVD, LPCVD, HDP-CVD, ALD, MOCVD, PVD, JVD, or other suitable deposition technique. The contact material layer is then planarized to expose nitride layer 320 and to provide contact material layer 338a. The contact material layer is planarized using chemical mechanical planarization (CMP) or another suitable planarization technique.

Figure 28:
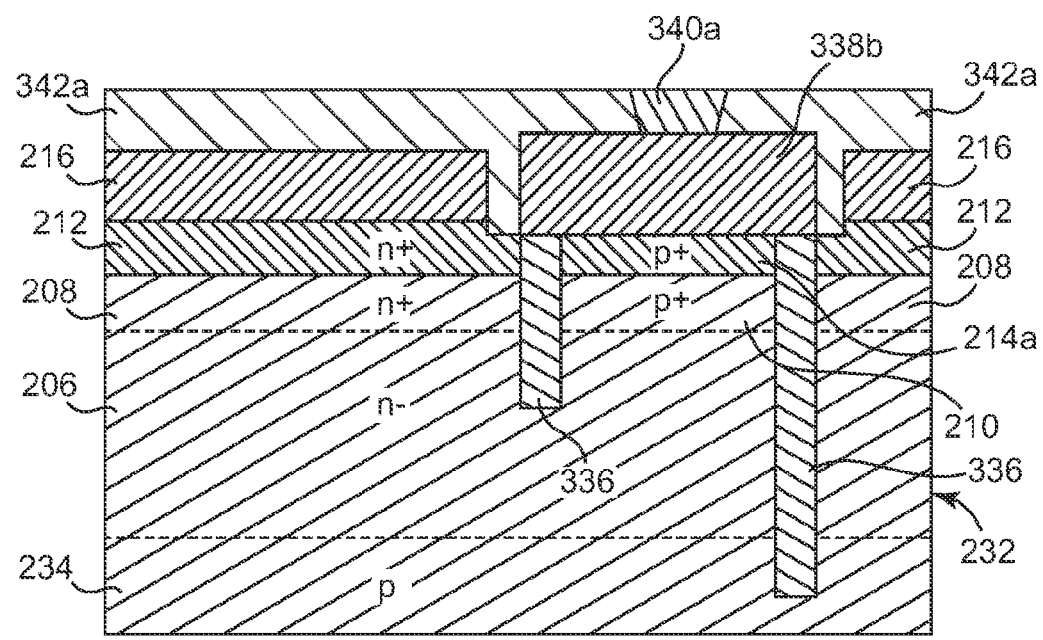
FIG. 28 illustrates a cross-sectional view of one embodiment of the substrate, the doped polysilicon layers, the word lines, a nitride layer, the oxide, the contact material layer, and a bottom electrode material layer.

FIG. 28 illustrates a cross-sectional view of one embodiment of substrate 232, doped polysilicon layers 212 and 214a, word lines 216, nitride layer 342a, oxide 336, a contact material layer 338b, and a bottom electrode material layer 340a. Contact material layer 338a is recess etched to provide contact material layer 338b. A nitride, such as $Si_xN_y$ or other suitable dielectric material is deposited over nitride layer 320 and contact material layer 338b to provide a nitride layer. The nitride layer is deposited using CVD, LPCVD, HDP-CVD, ALD, MOCVD, PVD, JVD, or other suitable deposition technique. The nitride layer is then spacer etched to expose a portion of contact material layer 338b and to provide nitride layer 342a, which includes nitride layer 320.

An electrically conductive material, such as TiN, TaN, W, Al, Ti, Ta, TiSiN, TaSiN, TiAlN, TaAlN, Cu, WN, CoSi, NiSi, NiPtSi, WSi, a combination thereof, or other suitable electrode material is deposited over exposed portions of nitride layer 342a and contact material layer 338b to provide an electrode material layer. The electrode material layer is deposited using CVD, LPCVD, HDP-CVD, ALD, MOCVD, PVD, JVD, or other suitable deposition technique. The electrode material layer is then planarized to expose nitride layer 342a and to provide bottom electrode material layer 340a. The electrode material layer is planarized using CMP or another suitable planarization technique. In one embodiment, bottom electrode material layer 340a has tapered sidewalls. In other embodiments, bottom electrode material layer 340a has another suitable shape.

FIG. 29A illustrates a cross-sectional view of one embodiment of substrate 232, doped polysilicon layers 212 and 214a, word lines 216, a nitride layer 342b, oxide 336, contact material layer 338b, bottom electrode material layer 340a, a phase change material layer 344a, and a top electrode material layer 346a. FIG. 29B illustrates another cross-sectional view through n+ doped polysilicon layer 212 and perpendicular to the view illustrated in FIG. 29A. FIG. 29C illustrates another cross-sectional view through p+ doped polysilicon layer 214a and perpendicular to the view illustrated in FIG. 29A.

A nitride, such as $Si_xN_y$ or other suitable dielectric material is deposited over nitride layer 342a and electrode material layer 340a to provide a nitride layer. The nitride layer is deposited using CVD, LPCVD, HDP-CVD, ALD, MOCVD, PVD, JVD, or other suitable deposition technique. The nitride layer is then etched to form a trench exposing a portion of electrode material layer 340a and to provide nitride layer 342b, which includes nitride layer 342a.

A phase change material, such as a chalcogenide compound material or other suitable phase change material is deposited over exposed portions of nitride layer 342b and bottom electrode material layer 340a to provide phase change material layer 344a. Phase change material layer 344a is deposited using CVD, LPCVD, HDP-CVD, ALD, MOCVD, PVD, JVD, or other suitable deposition technique. An electrically conductive material, such as TiN, TaN, W, Al, Ti, Ta, TiSiN, TaSiN, TiAlN, TaAlN, Cu, WN, CoSi, NiSi, NiPtSi, WSi, a combination thereof, or other suitable electrode material is deposited over phase change material layer 344a to provide top electrode material layer 346a. Top electrode material layer 346a is deposited using CVD, LPCVD, HDP-CVD, ALD, MOCVD, PVD, JVD, or other suitable deposition technique.

FIG. 30A illustrates a top view and FIGS. 30B and 30C illustrate cross-sectional views of one embodiment of substrate 232, doped polysilicon layers 212 and 214, word lines 216, nitride layer 342, oxide 336, a contact 220, a bottom electrode 340, a phase change element 344, and a bit line 346 after etching. Top electrode material layer 346a, phase change material layer 344a, nitride layer 342b, bottom electrode material layer 340a, contact material layer 338b, and p+ doped polysilicon layer 214a are etched to expose insulation material 302 and to provide p+ doped polysilicon layer 214, contact 220, bottom electrode 340, nitride layer 342, phase change element 344, and bit line 346. In this way, p+ doped polysilicon layer 214, contact 220, bottom electrode 340, and phase change element 344 are self-aligned to bit line 346.

Insulation material, such $SiO_2$, $SiO_x$, $Si_xN_y$, FSG, BPSG, BSG, or other suitable dielectric material is deposited over exposed portions of insulation material 302, p+ doped polysilicon layer 214, contact 220, bottom electrode 340, nitride layer 342, phase change element 344, and bit line 346 to provide an insulation material layer (not shown). The insulation material layer is then planarized to expose bit line 346. The insulation material layer is planarized using CMP or another suitable planarization technique. In other embodiments, bottom electrode 340, nitride layer 342, and phase change element 344 are fabricated to provide any suitably shaped bottom electrode 340 and phase change element 344.

The following FIGS. 31-36B illustrate another embodiment for fabricating a phase change memory cell, such as a phase change memory cell 104 previously described and illustrated with reference to FIG. 2. To begin, the process previously described and illustrated with reference to FIGS. 9A-23 is performed.

Figure 31:
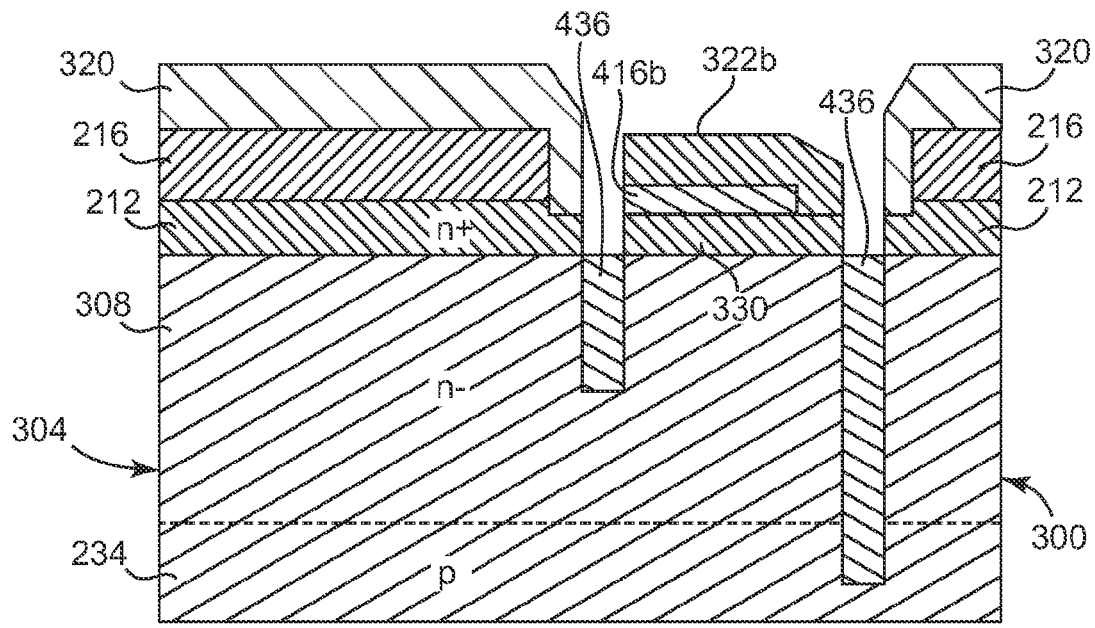
FIG. 31 illustrates a cross-sectional view of one embodiment of the substrate, the doped polysilicon layers, the word lines, the nitride layer, the polysilicon layer, the oxide layer, and the oxide.

FIG. 31 illustrates a cross-sectional view of one embodiment of substrate 300, doped polysilicon layers 212 and 330, word lines 216, nitride layer 320, polysilicon layer 322b, oxide layer 416b, and oxide 436. Oxide 336a is back-etched down to the surface of active area 304 to provide oxide 436.

Figure 32:
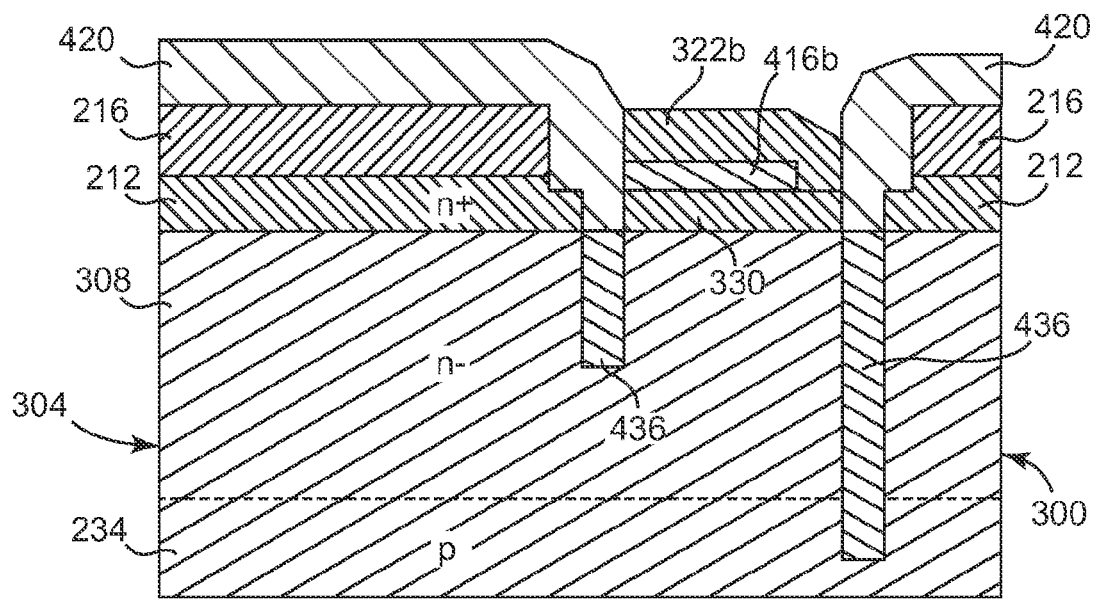
FIG. 32 illustrates a cross-sectional view of one embodiment of the substrate, the doped polysilicon layers, the word lines, a nitride layer, the polysilicon layer, the oxide layer, and the oxide.

FIG. 32 illustrates a cross-sectional view of one embodiment of substrate 300, doped polysilicon layers 212 and 330, word lines 216, a nitride layer 420, polysilicon layer 322b, oxide layer 416b, and oxide 436. A nitride, such as $Si_xN_y$ or other suitable dielectric material is deposited over exposed portions of nitride layer 320, polysilicon layer 322b, oxide layer 416b, doped polysilicon layers 212 and 330, and oxide 426 to provide a nitride layer. The nitride layer is deposited using CVD, LPCVD, HDP-CVD, ALD, MOCVD, PVD, JVD, or other suitable deposition technique. The nitride layer is then spacer etched to expose polysilicon layer 322b and to provide nitride layer 420, which includes nitride layer 320.

Figure 33A:
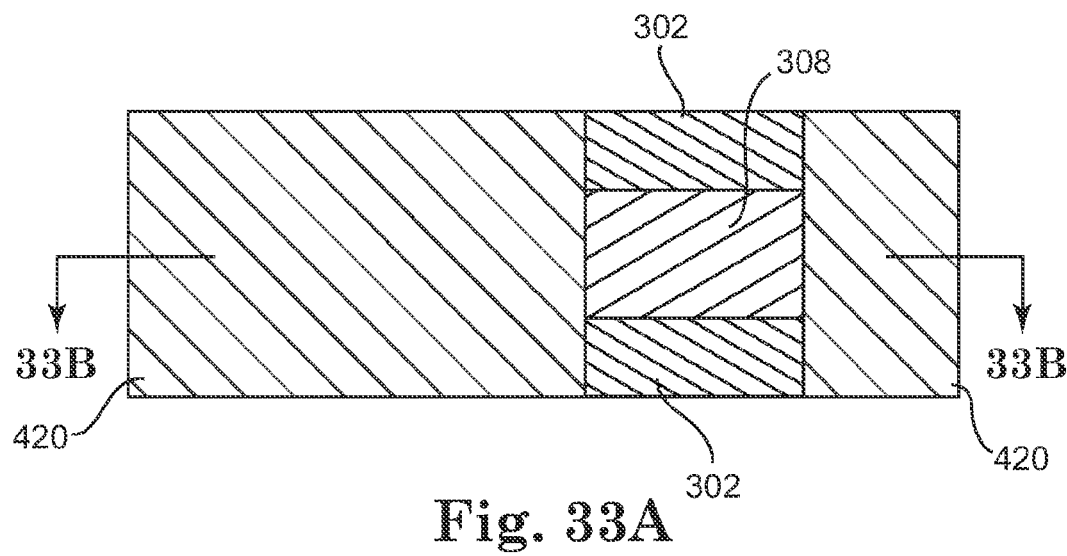
FIG. 33A illustrates a top view of one embodiment of the substrate, the doped polysilicon layer, the word lines, and the nitride layer after etching.
Figure 33B:
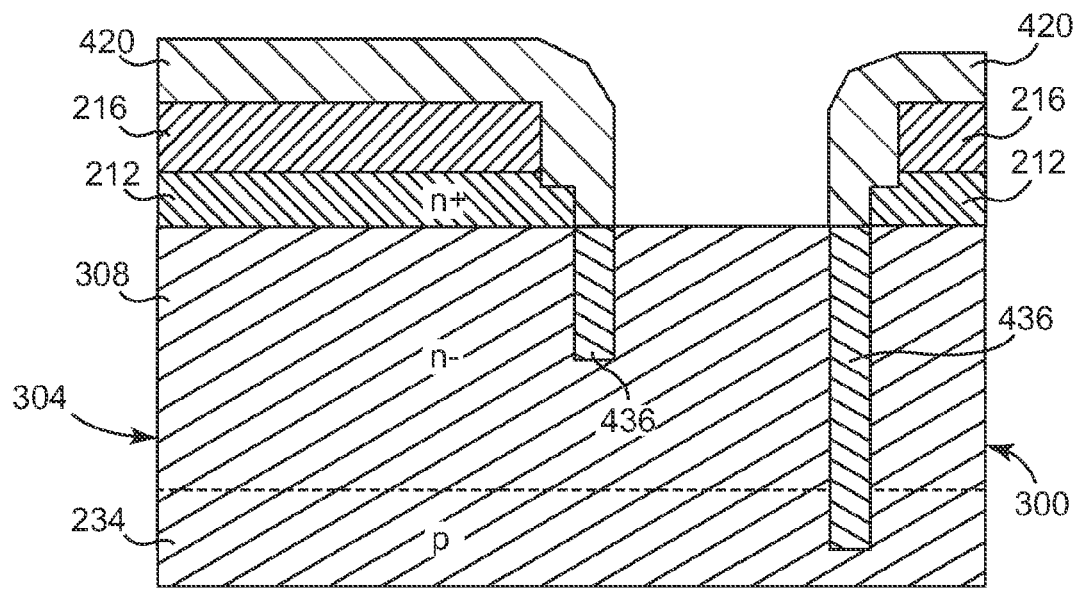
FIG. 33B illustrates a cross-sectional view of one embodiment of the substrate, the doped polysilicon layer, the word lines, and the nitride layer after etching.

FIG. 33A illustrates a top view and FIG. 33B illustrates a cross-sectional view of one embodiment of substrate 300, doped polysilicon layer 212, word lines 216, and nitride layer 420 after etching. Polysilicon layer 322b, oxide layer 416b, and doped polysilicon layer 330 are etched to expose n− doped region 308 and insulation material 302 of substrate 300.

Figure 34:
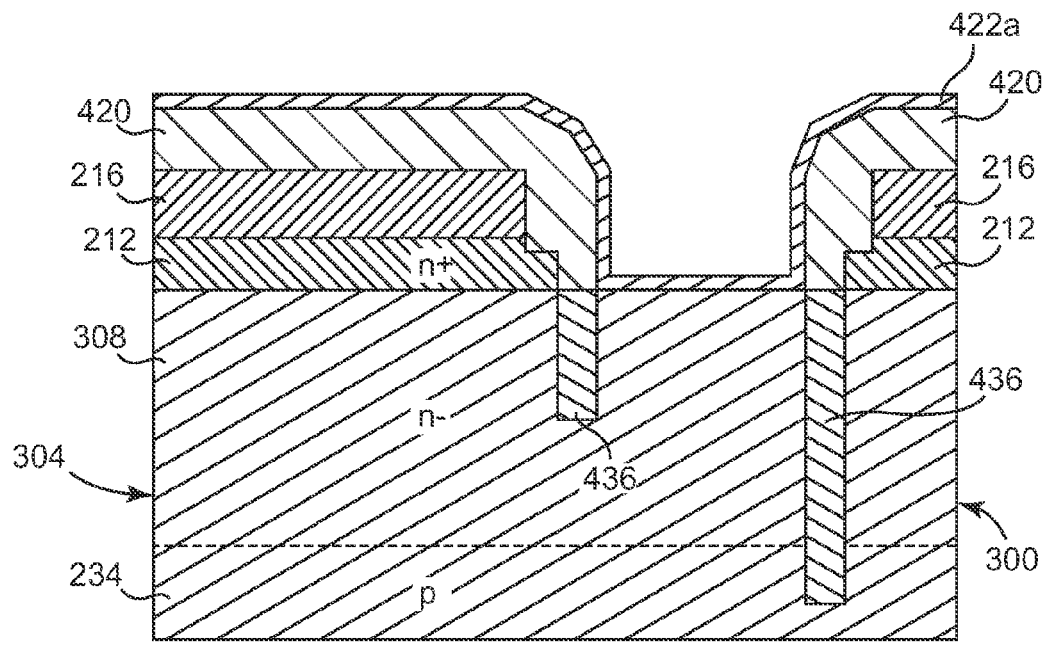
FIG. 34 illustrates a cross-sectional view of one embodiment of the substrate, the doped polysilicon layer, the word lines, the nitride layer, the oxide, and an optional nitride liner.

FIG. 34 illustrates a cross-sectional view of one embodiment of substrate 300, doped polysilicon layer 212, word lines 216, nitride layer 420, oxide 436, and an optional nitride liner 422a. A nitride, such as $Si_xN_y$ or other suitable dielectric material is deposited over exposed portions of nitride layer 420 and n− doped region 308 and insulation material 302 of substrate 300 to provide optional nitride liner 422a. Optional nitride liner 422a is deposited using CVD, LPCVD, HDP-CVD, ALD, MOCVD, PVD, JVD, or other suitable deposition technique.

Figure 35:
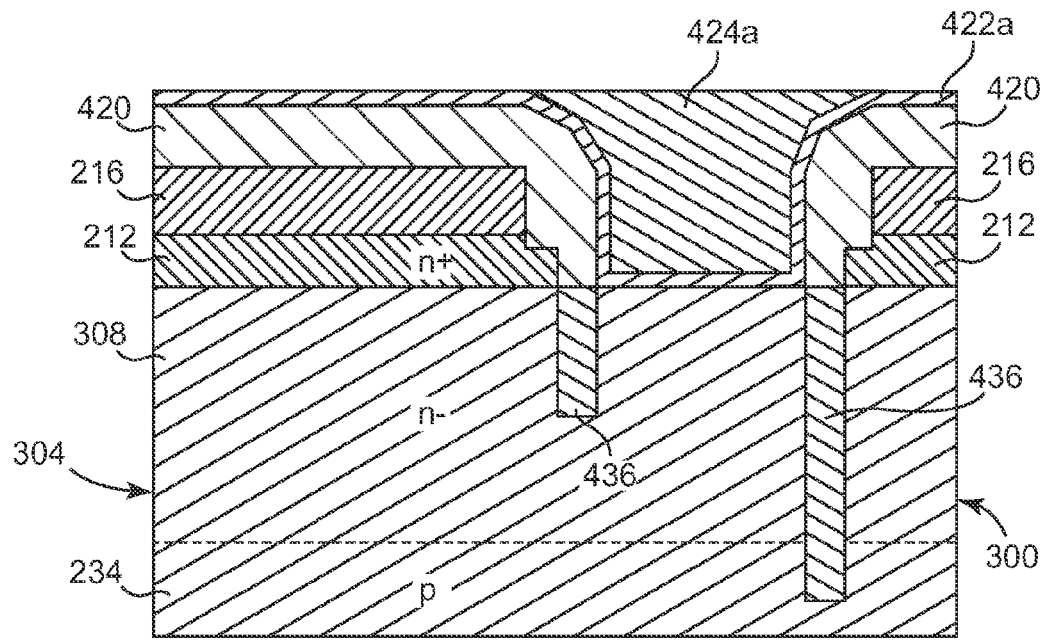
FIG. 35 illustrates a cross-sectional view of one embodiment of the substrate, the doped polysilicon layer, the word lines, the nitride layer, the oxide, the nitride liner, and an oxide layer.

FIG. 35 illustrates a cross-sectional view of one embodiment of substrate 300, doped polysilicon layer 212, word lines 216, nitride layer 420, oxide 436, nitride liner 422a, and an oxide layer 424a. An oxide, such as $SiO_2$ or other suitable dielectric material is deposited over nitride liner 422a to provide an oxide layer. The oxide layer is deposited using CVD, LPCVD, HDP-CVD, ALD, MOCVD, PVD, JVD, or other suitable deposition technique. The oxide layer is planarized to expose nitride liner 422a and to provide oxide layer 424a. The oxide layer is planarized using CMP or another suitable planarization technique.

Figure 36A:
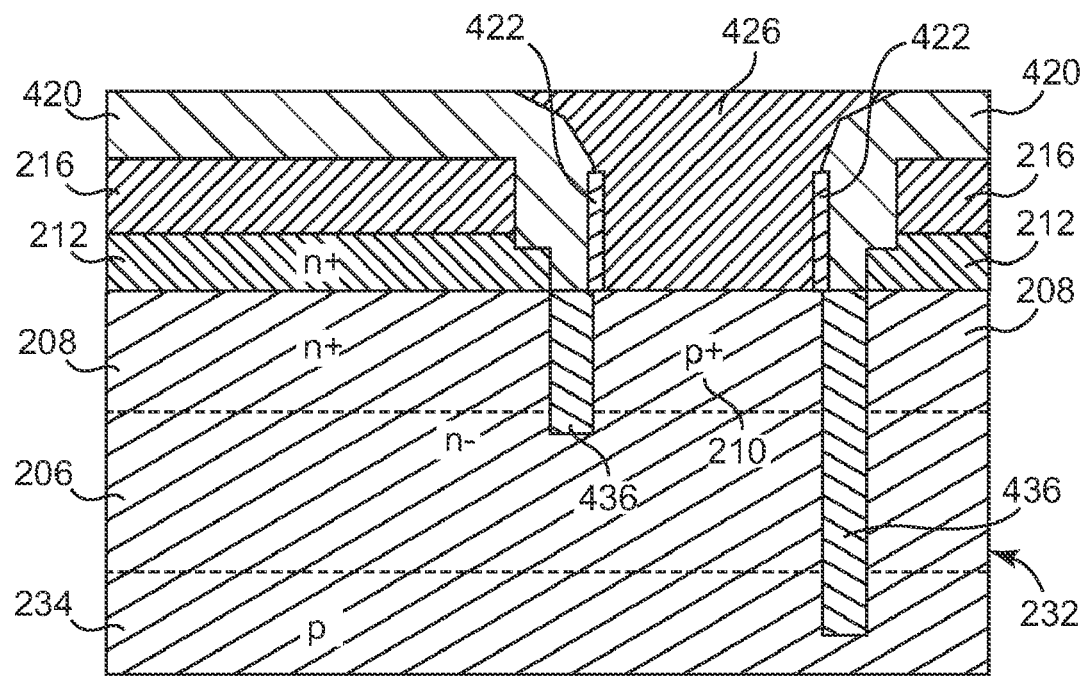
FIG. 36A illustrates a cross-sectional view of one embodiment of the substrate, the doped polysilicon layer, the word lines, the nitride layer, the oxide, the nitride liner, the oxide layer, and a contact material layer.
Figure 36B:
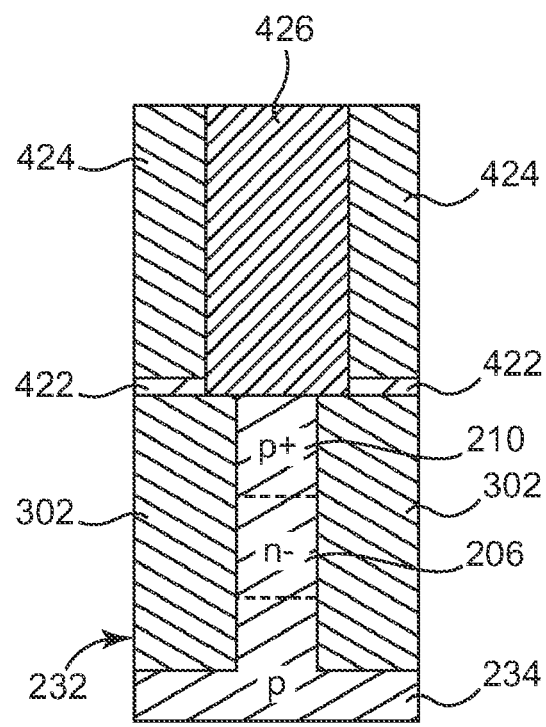
FIG. 36B illustrates another cross-sectional view of one embodiment of the substrate, the doped polysilicon layer, the word lines, the nitride layer, the oxide, the nitride liner, the oxide layer, and a contact material layer.

FIG. 36A illustrates a cross-sectional view of one embodiment of substrate 232, doped polysilicon layer 212, word lines 216, nitride layer 420, oxide 436, nitride liner 422, oxide layer 424, and a contact material layer 426. FIG. 36B illustrates another cross-sectional view through contact material layer 426 and perpendicular to the view illustrated by FIG. 36A. Exposed portions of nitride liner 422a are etched to expose nitride layer 420. Portions of oxide material layer 424a and the underlying portions of nitride liner 422a are etched to expose a portion of n− doped region 308 of substrate 300 and to provide oxide material layer 424 and nitride liner 422.

The exposed portions of n− doped region 308 are doped using ion implantation or another suitable technique to provide p+ doped region 210. Substrate 300 and doped polysilicon layer 212 are annealed to provide substrate 232. During annealing, dopants from n+ doped polysilicon layer 212 diffuse into the underlying n− doped region 308 to provide n+ doped region 208. The bottom of n+ doped region 208 and the bottom of p+ doped region 210 contact the top of n− doped region 206. The n+ doped region 208 is in the same horizontal plane as p+ doped region 210 and is separated from p+ doped region 210 by oxide 436. Therefore, a U-shaped bipolar transistor is formed in substrate 232.

An electrically conductive material, such as TiN, TaN, W, Al, Ti, Ta, TiSiN, TaSiN, TiAlN, TaAlN, Cu, WN, CoSi, NiSi, NiPtSi, WSi, a combination thereof, or other suitable contact material is deposited over exposed portions of nitride layer 420, nitride liner 422, and p+ doped region 210 to provide a contact material layer. The contact material layer is deposited using CVD, LPCVD, HDP-CVD, ALD, MOCVD, PVD, JVD, or other suitable deposition technique. The contact material layer is then planarized to expose nitride layer 420 and to provide contact material layer 426. The contact material layer is planarized using CMP or another suitable planarization technique. A process similar to the process previously described and illustrated with reference to FIGS. 28-30C is then performed to complete the fabrication of the phase change memory cell.

Embodiments provide U-shaped diodes or bipolar transistors for accessing resistive memory cells. Contact to the U-shaped diodes or bipolar transistors is made from the top of the access devices through polysilicon layers, which provide large metal to silicon transition areas. An array of the U-shaped access devices does not include buried metal lines thereby avoiding large series resistances. In addition, the self-alignment of the memory cells reduces area consumption to provide smaller memory cells compared to typical memory cells.

While the specific embodiments described herein substantially focused on using phase change memory elements, the embodiments can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a U-shaped access device;
   a first line coupled to a first side of the access device;
   a contact coupled to a second side of the access device; and
   self-aligned dielectric material isolating the first line from the contact.

2. The integrated circuit of claim 1, wherein the access device is provided in a substrate, the access device comprising:
   a doped first region having a first polarity;
   a doped second region having a second polarity opposite the first polarity, the second region isolated from the first region by the dielectric material; and a doped third region having the first polarity, a top of the third region contacting a bottom of the first region and a bottom of the second region.

3. The integrated circuit of claim 1, wherein the access device comprises one of a diode and a bipolar transistor.

4. The integrated circuit of claim 1, further comprising:
a resistance changing memory element, a first side of the memory element coupled to the contact; and
a second line coupled to a second side of the memory element.

5. The integrated circuit of claim 1, further comprising:
a first silicon layer coupling the first line to the access device.

6. The integrated circuit of claim 2, wherein the substrate includes a doped fourth region having the second polarity, a top of the fourth region contacting a bottom of the third region.

7. The integrated circuit of claim 2, wherein the substrate comprises a silicon on insulator structure including an insulating material layer, a top of the insulating material layer contacting a bottom of the third region.

8. The integrated circuit of claim 4, wherein the memory element and the contact are self-aligned to the second line.

9. The integrated circuit of claim 4, wherein the memory element comprises a phase change element.

10. The integrated circuit of claim 5, further comprising:
a second silicon layer coupling the contact to the access device.

11. A system comprising:
a host; and
a memory device communicatively coupled to the host, the memory device comprising:
a U-shaped access device;
a first metal line coupled to a first side of the access device;
a metal contact coupled to a second side of the access device; and
a phase change element, a first side of the phase change element coupled to the metal contact.

12. The system of claim 11, wherein the access device is provided in a substrate, the access device comprising:
a heavily doped first region having a first polarity;
a heavily doped second region having a second polarity opposite the first polarity, the second region isolated from the first region; and
a lightly doped third region having the first polarity, a top of the third region contacting a bottom of the first region and a bottom of the second region.

13. The system of claim 11, wherein the access device comprises one of a diode and a bipolar transistor.

14. The system of claim 11, wherein the memory device further comprises:
a metal bit line coupled to a second side of the phase change element,
wherein the first metal line comprises a word line.

15. The system of claim 14, wherein the phase change element and the contact are self-aligned to the bit line.

16. A method for fabricating an integrated circuit, the method comprising:
fabricating a U-shaped access device in a substrate;
fabricating a first line coupled to a first side of the access device;
fabricating a contact coupled to a second side of the access device; and
fabricating a resistive memory element having a first side coupled to the contact.

17. The method of claim 16, wherein fabricating the access device comprises fabricating a diode in a silicon on insulator structure.

18. The method of claim 16, wherein fabricating the access device comprises fabricating a bipolar transistor in a silicon substrate.

19. The method of claim 16, further comprising:
fabricating a second line coupled to a second side of the phase change element.

20. The method of claim 16, wherein fabricating the access device comprises:
providing the substrate including an active area and isolation regions, the active area including a first region having a first polarity;
depositing a doped first silicon layer over the substrate, the first silicon layer having the first polarity;
depositing an electrically conductive material layer over the first silicon layer;
depositing a nitride layer over the electrically conductive material layer;
etching a portion of the nitride layer and the electrically conductive material layer to provide an opening exposing a portion of the first silicon layer;
nitridizing the exposed portion of the first silicon layer to provide a nitridation layer;
damaging a portion of the nitridation layer;
oxidizing the damaged portion of the nitridation layer and the underlying portion of the first silicon layer to provide a first oxide layer;
removing an undamaged portion of the nitridation layer;
depositing a second silicon layer over exposed portions of the first silicon layer, the nitride layer, and the first oxide layer;
depositing a second oxide layer over the second silicon layer in the opening;
etching exposed portions of the second silicon layer and underlying portions of the first silicon layer and the active area to provide a first trench having a first depth and to expose a portion of the first oxide layer;
etching the exposed portion of the first oxide layer and underlying portions of the first silicon layer and the active area to provide a second trench having a second depth less than the first depth;
filling the first trench and the second trench with a dielectric material;
removing the second oxide layer, the second silicon layer, and the first oxide layer to expose a portion of the first silicon layer;
doping the exposed portion of the first silicon layer to provide a doped third silicon layer having a second polarity opposite the first polarity; and
annealing the first and third silicon layers to diffuse dopants into a portion of the first region to provide the access device.

21. The method of claim 16, wherein fabricating the access device comprises:
providing the substrate including an active area and isolation regions, the active area including a first region having a first polarity;
depositing a doped first silicon layer over the substrate, the first silicon layer having the first polarity;
depositing an electrically conductive material layer over the first silicon layer;
depositing a first nitride layer over the electrically conductive material layer;

etching a portion of the first nitride layer and the electrically conductive material layer to provide an opening exposing a portion of the first silicon layer;
nitridizing the exposed portion of the first silicon layer to provide a nitridation layer;
damaging a portion of the nitridation layer;
oxidizing the damaged portion of the nitridation layer and the underlying portion of the first silicon layer to provide a first oxide layer;
removing an undamaged portion of the nitridation layer;
depositing a second silicon layer over exposed portions of the first silicon layer, the first nitride layer, and the first oxide layer;
depositing a second oxide layer over the second silicon layer in the opening;
etching exposed portions of the second silicon layer and underlying portions of the first silicon layer and the active area to provide a first trench in the substrate having a first depth and to expose a portion of the first oxide layer;
etching the exposed portion of the first oxide layer and underlying portions of the first silicon layer and the active area to provide a second trench in the substrate having a second depth less than the first depth;
filling the first trench and the second trench with a dielectric material;
removing the second oxide layer;
depositing a second nitride layer over exposed portions of the first nitride layer, the dielectric material, the second silicon layer, the first oxide layer, and the first silicon layer;
spacer etching the second nitride layer to expose the second silicon layer;
removing the second silicon layer, the first oxide layer, and the underlying portion of the first silicon layer to expose the substrate;
heavily doping the exposed substrate to provide a doped second region in the substrate having a second polarity opposite the first polarity; and
annealing the first silicon layer to diffuse dopants into the substrate to provide a doped third region in the substrate having the first polarity.

22. The method of claim 20, wherein damaging the portion of the nitridation layer comprises implanting the portion of the nitridation layer using an angled implantation.

23. The method of claim 20, wherein fabricating the access device further comprises:
oxidizing exposed portions of the first silicon layer, the second silicon layer, and the active area after etching to provide the second trench.

24. The method of claim 21, wherein damaging the portion of the nitridation layer comprises implanting the portion of the nitridation layer using an angled implantation.

25. The method of claim 21, wherein fabricating the access device further comprises:
oxidizing exposed portions of the first silicon layer, the second silicon layer, and the active area after etching to provide the second trench.

* * * * *